(12) United States Patent
Wang et al.

(10) Patent No.: US 12,538,760 B2
(45) Date of Patent: Jan. 27, 2026

(54) METHOD OF MANUFACTURING A SEMICONDUCTOR DEVICE

(71) Applicant: TAIWAN SEMICONDUCTOR MANUFACTURING COMPANY, LTD., Hsinchu (TW)

(72) Inventors: Yu-Fu Wang, New Taipei (TW); Shih-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 635 days.

(21) Appl. No.: 17/736,821

(22) Filed: May 4, 2022

(65) Prior Publication Data

US 2023/0162980 A1 May 25, 2023

Related U.S. Application Data

(60) Provisional application No. 63/282,008, filed on Nov. 22, 2021.

(51) Int. Cl.
*H01L 21/027* (2006.01)
*G03F 7/09* (2006.01)
(Continued)

(52) U.S. Cl.
CPC .......... *H01L 21/0274* (2013.01); *G03F 7/094* (2013.01); *H01L 21/31144* (2013.01); *G03F 1/24* (2013.01)

(58) Field of Classification Search
CPC .......... H01L 21/0274; H01L 21/31144; H01L 21/0275; H01L 21/0273–0279;
(Continued)

(56) References Cited

U.S. PATENT DOCUMENTS 5,314,789 A 5/1994 Hawkins et al.
8,178,284 B2 5/2012 Kohno et al.
(Continued)

FOREIGN PATENT DOCUMENTS

TW 574608 B 2/2004
TW 200827935 A 7/2008
(Continued)

OTHER PUBLICATIONS

Ming-Chung Wu et al., "Nanopatterned optical and Magnetic La0.6Ca0.4MnO3 arrays: Synthesis, fabrication and properties," Journal of Material Research, 24(2): 394-403 (Feb. 2009).
(Continued)

*Primary Examiner* — Steven B Gauthier
*Assistant Examiner* — Adam D Weiland
(74) *Attorney, Agent, or Firm* — STUDEBAKER BRACKETT PLLC

(57) ABSTRACT

A method of manufacturing a semiconductor device includes forming a first tone resist layer over an underlayer. The first tone resist layer is pattern to form a first pattern exposing a portion of the underlayer. The first pattern is extended into the underlayer, and the first tone resist layer is removed. A second tone resist layer is formed over the underlayer, wherein the second tone is opposite the first tone. The second tone resist layer is patterned to form a second pattern exposing another portion of the underlayer. The second pattern is extended into underlayer, and the second tone resist layer is removed.

20 Claims, 11 Drawing Sheets

(51) Int. Cl.
*H01L 21/311* (2006.01)
*G03F 1/24* (2012.01)

(58) Field of Classification Search
CPC ......... H01L 21/312–3128; G03F 7/094; G03F 7/2024; G03F 7/203; G03F 7/70466; G03F 7/0035; G03F 7/095; G03F 1/24; G03F 7/004–115; G03F 7/20–24; G03F 7/70–70991
See application file for complete search history.

(56) References Cited

U.S. PATENT DOCUMENTS

| | | | |
|---|---|---|---|
| 8,796,666 | B1 | 8/2014 | Huang et al. |
| 8,932,803 | B2 | 1/2015 | Hatakeyama et al. |
| 9,093,530 | B2 | 7/2015 | Huang et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 9,857,684 | B2 | 1/2018 | Lin et al. |
| 9,859,206 | B2 | 1/2018 | Yu et al. |
| 9,875,892 | B2 | 1/2018 | Chang et al. |
| 11,126,077 | B2 | 9/2021 | Hsu et al. |
| 2005/0089763 | A1* | 4/2005 | Tan ........................... G03F 1/32 430/312 |
| 2011/0091812 | A1* | 4/2011 | Hatakeyama ......... G03F 7/0045 430/326 |
| 2011/0262860 | A1* | 10/2011 | Willson ................ G03F 7/0236 430/324 |
| 2012/0202158 | A1* | 8/2012 | Hatakeyama ......... G03F 7/0397 430/325 |
| 2012/0205818 | A1* | 8/2012 | Lin .................. H01L 23/53295 430/286.1 |
| 2012/0308930 | A1* | 12/2012 | Hatakeyama ......... G03F 7/0395 430/296 |
| 2020/0041891 | A1* | 2/2020 | Hsu ........................... G03F 1/38 |
| 2022/0351966 | A1* | 11/2022 | Devilliers ................ G03F 7/40 |

FOREIGN PATENT DOCUMENTS

| | | |
|---|---|---|
| TW | 201437755 A | 10/2014 |
| TW | 202030542 A | 8/2020 |

OTHER PUBLICATIONS

Yu Zhang et al., "Dual-tone Application of a Tin-Oxo Cage Photoresist Under E-beam and EUV Exposure," Journal of Photopolymer Science and Technology, 31(2): 249-255 (2018).

* cited by examiner

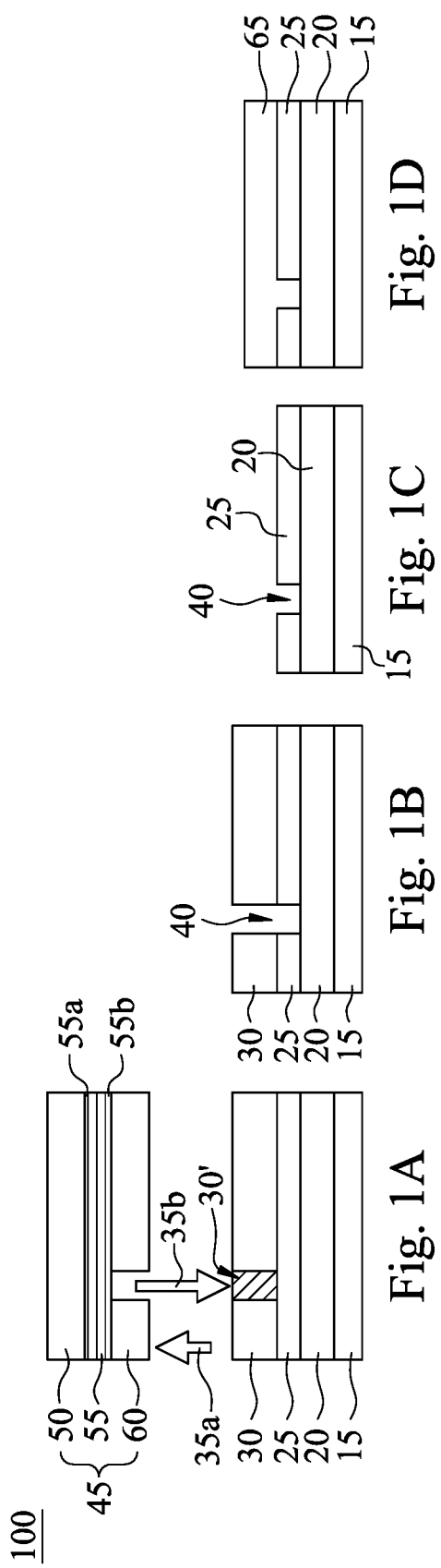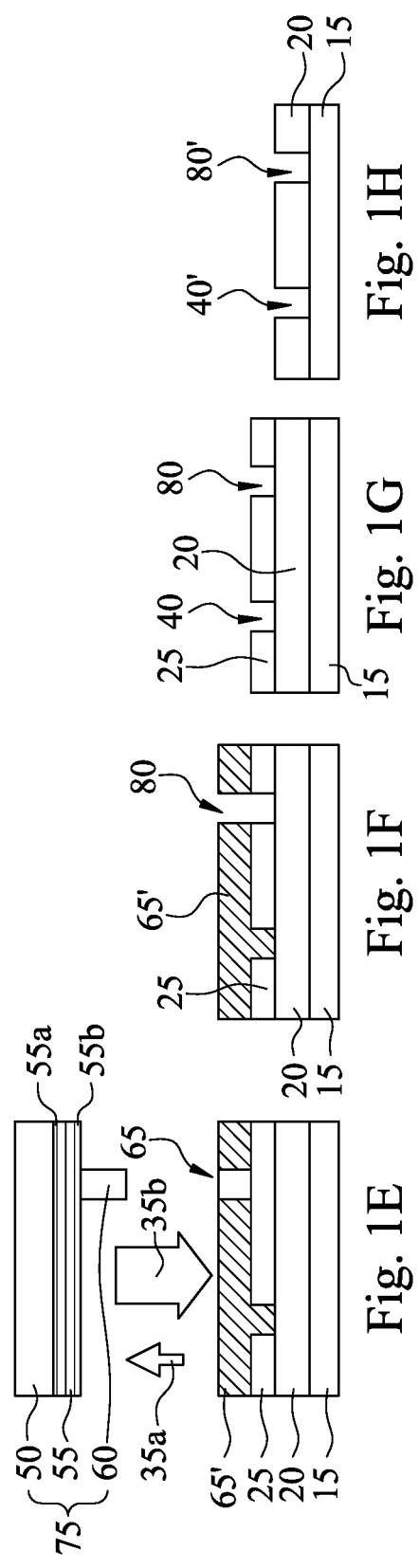

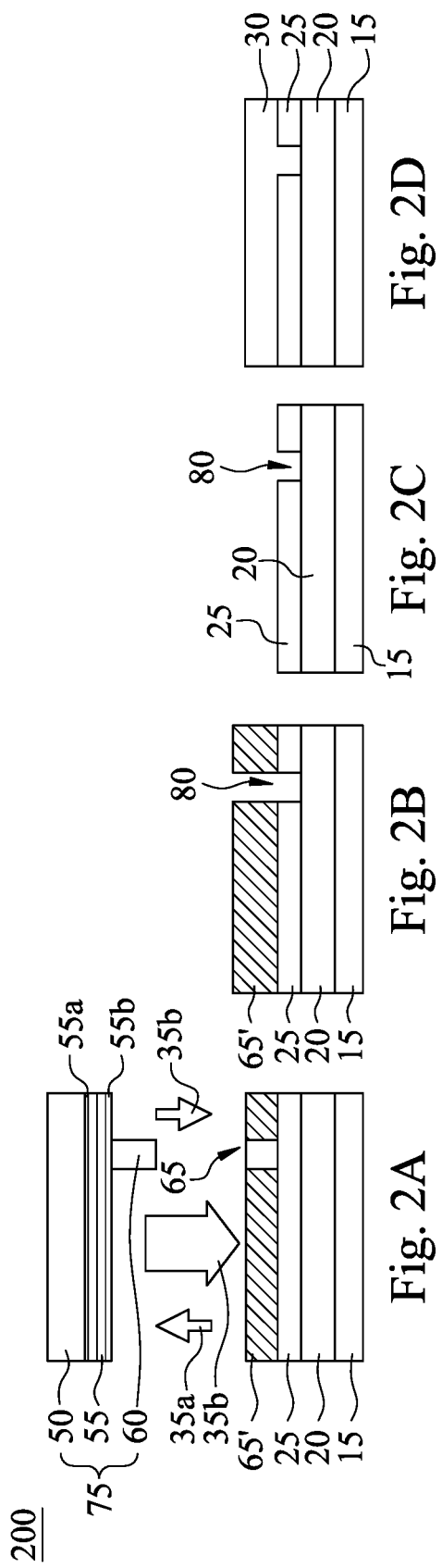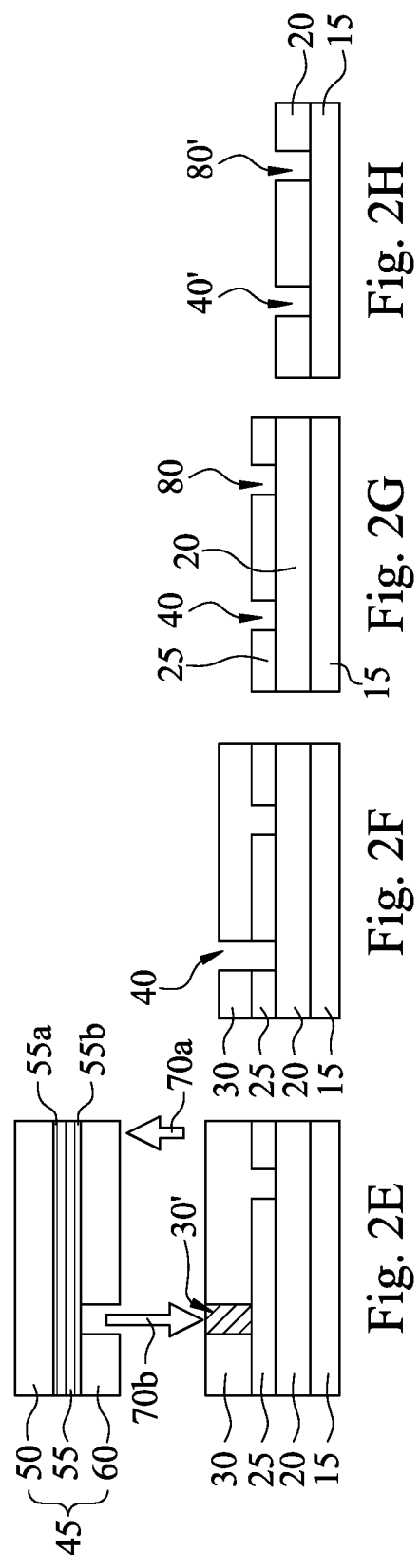

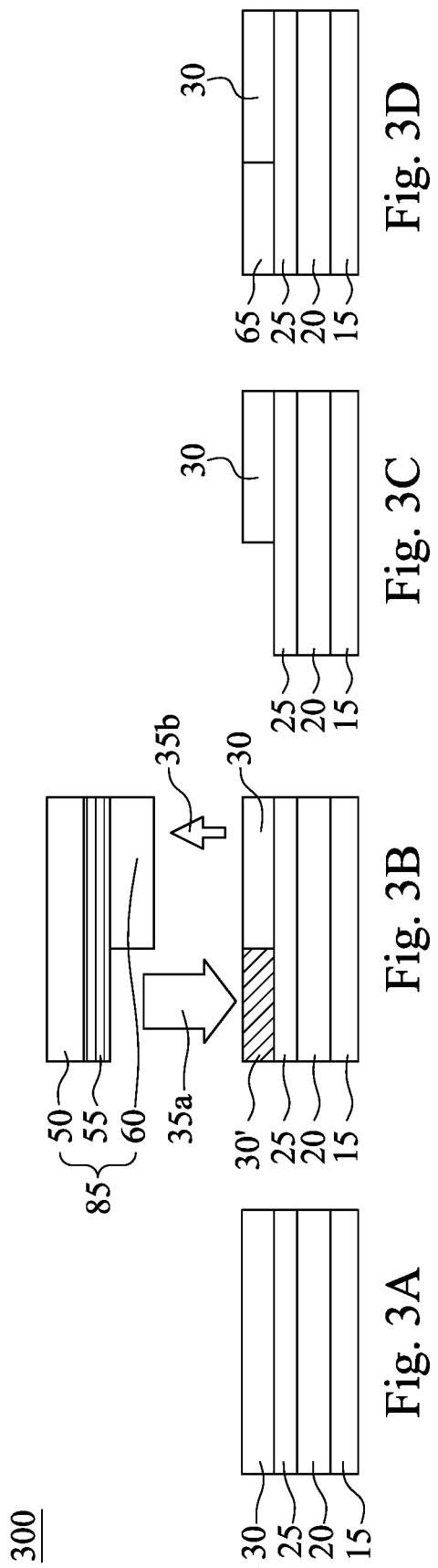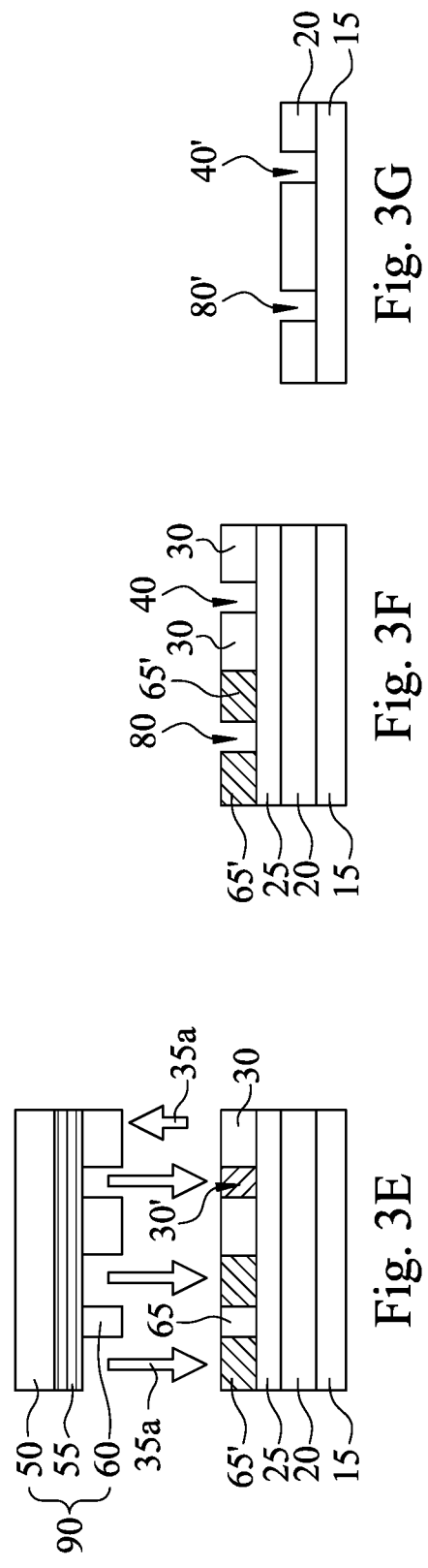

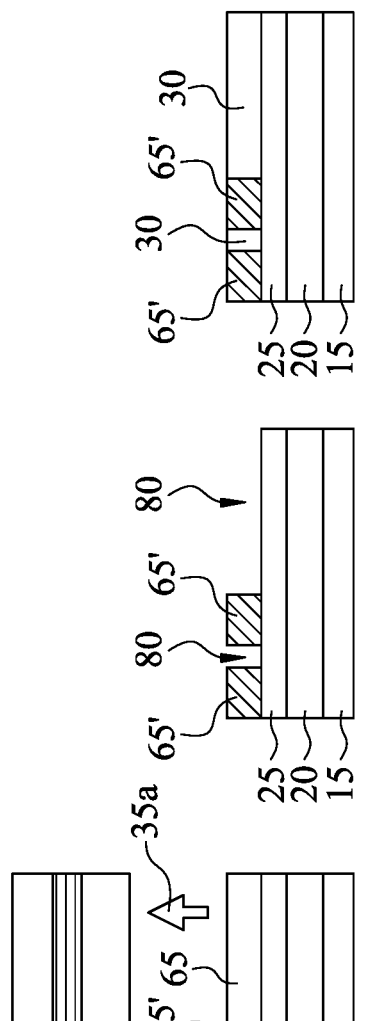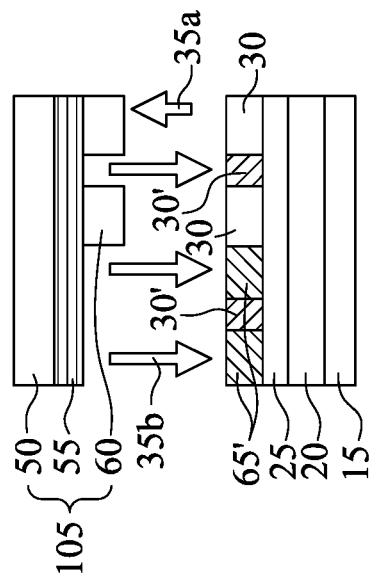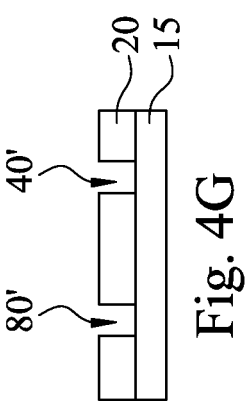

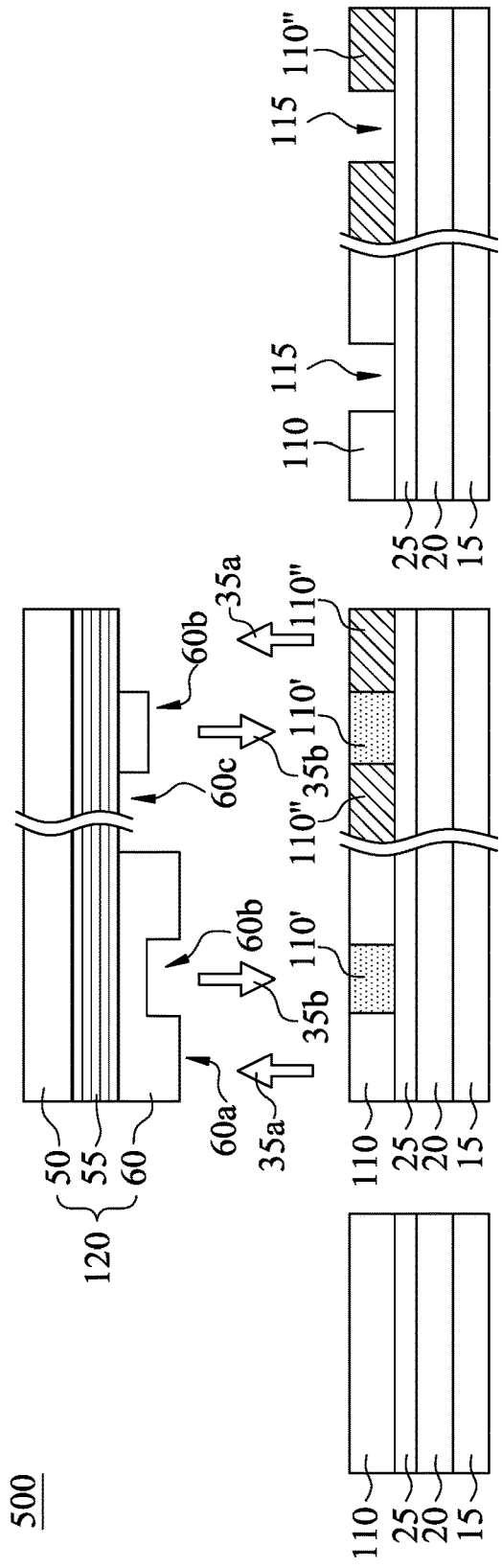

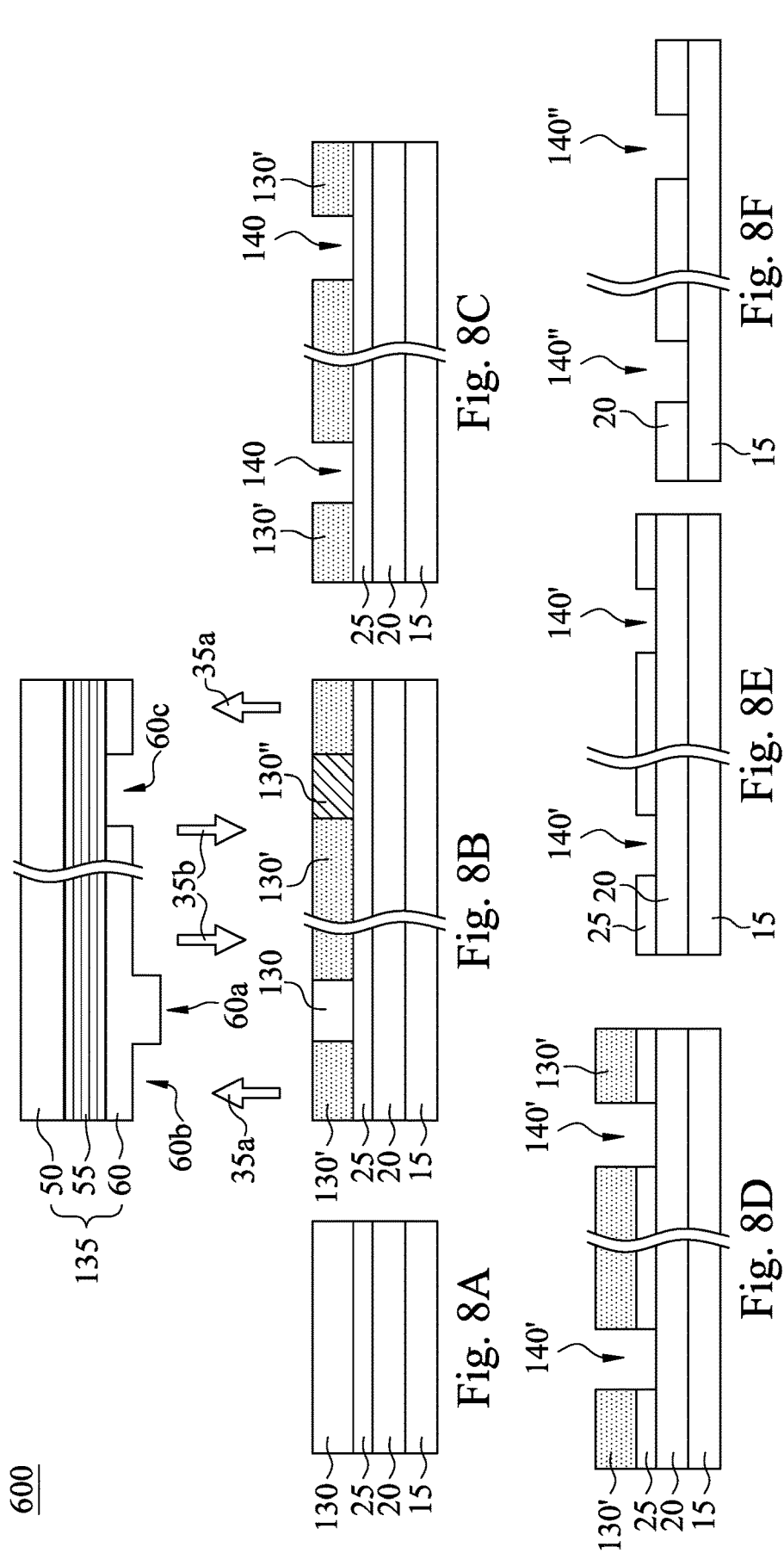

METHOD OF MANUFACTURING A SEMICONDUCTOR DEVICE

RELATED APPLICATION

This application claims priority to U.S. Provisional Patent Application No. 63/282,008, filed Nov. 22, 2021, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy beam that has itself been patterned. Such an exposure modifies the chemical and physical properties of the exposed regions of the photosensitive material. This modification, along with the lack of modification in regions of the photosensitive material that were not exposed, can be exploited to remove one region without removing the other, or vice-versa.

However, as the size of individual devices has decreased, process windows for photolithographic processing have become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D, 1E, 1F, 1G, and 1H illustrate a process flow of manufacturing a semiconductor device according to embodiments of the disclosure.

FIGS. 2A, 2B, 2C, 2D, 2E, 2F, 2G, and 2H illustrate a process flow of manufacturing a semiconductor device according to embodiments of the disclosure.

FIGS. 3A, 3B, 3C, 3D, 3E, 3F, and 3G illustrate a process flow of manufacturing a semiconductor device according to embodiments of the disclosure.

FIGS. 4A, 4B, 4C, 4D, 4E, 4F, and 4G illustrate a process flow of manufacturing a semiconductor device according to embodiments of the disclosure.

FIGS. 6A, 6B, 6C, 6D, 6E, and 6F illustrate a process flow of manufacturing a semiconductor device according to embodiments of the disclosure.

FIGS. 8A, 8B, 8C, 8D, 8E, and 8F illustrate a process flow of manufacturing a semiconductor device according to embodiments of the disclosure.

DETAILED DESCRIPTION

Figure 5B:
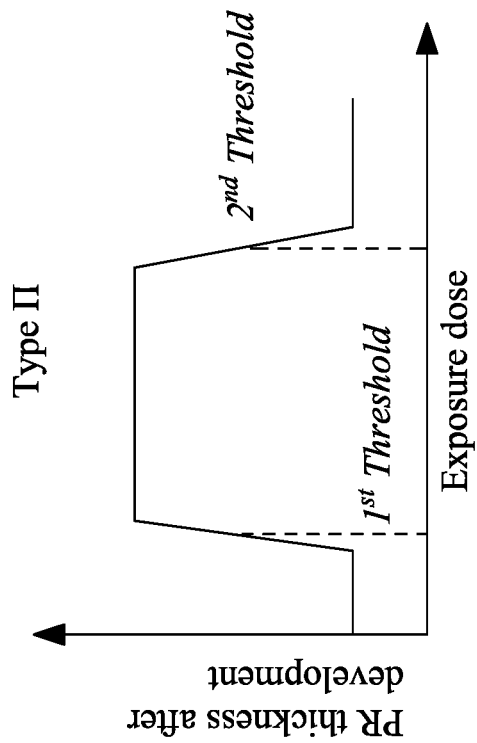
FIGS. 5A and 5B illustrate photoresist development thresholds for amphoteric photoresists according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Some features formed by photolithographic patterning operations may benefit from a positive-tone development, while other features may benefit from a negative-tone development. For example, in an extreme ultraviolet photolithographic patterning operation using an extreme ultraviolet exposure tool having a numerical aperture (NA)=0.33, it is more beneficial in some embodiments to use negative-tone development for forming contact hole patterns having a pitch less than about 30 nm, and use positive-tone development for forming contact hole patterns having a pitch greater than about 30 nm.

FIGS. 1A-1H illustrate a process flow 100 of manufacturing a semiconductor device according to embodiments of the disclosure. In some embodiments, a layer to be patterned (or a target layer) 20 is formed over a substrate 15, as shown in FIG. 1A. In some embodiments, one or more layers are formed between the substrate 15 and the target layer 20. In some embodiments, the one or more layers formed between the substrate 15 and the target layer includes semiconductor devices, such as field effect transistors, resistors, capacitors, and inductors. A hard mask layer 25 is formed over the surface of a layer to be patterned (or target layer) 20 in some embodiments or, when the target layer 20 not formed, over the surface of the substrate 15. A first resist layer 30 is subsequently formed over the hard mask layer 25 in some embodiments. In other embodiments, the first resist layer 30 is formed directly over the target layer 20. The first resist layer 30 undergoes a first baking (or pre-exposure baking) operation to evaporate solvents in the resist composition in some embodiments.

The first photoresist layer 30 is a photosensitive layer that is patterned by exposure to actinic radiation. Typically, the chemical properties of the photoresist regions struck by incident radiation change in a manner that depends on the type of photoresist used. The photoresists are positive-tone resists or negative-tone resists. A positive-tone resist refers to a photoresist material that when exposed to radiation (e.g.—UV light) becomes soluble in a developer, while the region of the photoresist that is non-exposed (or exposed less) is insoluble in the developer. A negative-tone resist, on the other hand, refers to a photoresist material that when exposed to radiation becomes insoluble in the developer, while the region of the photoresist that is non-exposed (or exposed less) is soluble in the developer. The region of a negative-tone resist that becomes insoluble upon exposure to radiation may become insoluble due to a cross-linking reaction caused by the exposure to radiation. In some embodiments, the resist is a negative-tone developed (NTD) resist. In a NTD resist, instead of the portion of the resist exposed to actinic radiation crosslinking, a developer solvent is selected that preferentially dissolves the unexposed portion of the resist to form the patterned resist.

In some embodiments, the ultraviolet radiation is deep ultraviolet (DUV) radiation. In some embodiments, the ultraviolet radiation is extreme ultraviolet (EUV or XUV) radiation. EUV and XUV are used interchangeably in this disclosure. In some embodiments, the radiation is an electron beam.

In some embodiments, the selective exposure of the first photoresist layer 30 to form exposed regions 30' and unexposed regions 30 is performed using extreme ultraviolet lithography. In some embodiments, the first photoresist layer 30 undergoes a post-exposure baking (PEB) operation after the selective exposure to actinic radiation 35b to further the chemical reaction occurring in the exposed regions 30' before developing the selectively exposed first photoresist layer.

A reflective photomask 45 is used to form the patterned exposure light in extreme ultraviolet lithography in some embodiments. The reflective photomask 45 includes a low thermal expansion glass substrate 50, on which a reflective multilayer 55 of alternating Si 55a and Mo 55b layers is formed. A patterned absorber layer 60 is formed on the reflective multilayer 55. In some embodiments, a capping layer (not shown) is formed between the multilayer 55 and the patterned absorber layer 60, and a rear conductive layer (not shown) is formed on the backside of the low thermal expansion glass substrate 50. Extreme ultraviolet radiation 35a is directed from an XUV radiation source (not shown) towards the reflective photomask 45 at an incident angle of about 6°. A portion 35b of the XUV radiation is reflected by the Si/Mo reflective multilayer 55 towards the photoresist-coated substrate, while the portion of the XUV radiation incident upon the absorber layer 60 is absorbed by the photomask 45. In some embodiments, additional optics, including mirrors, are between the reflective photomask 45 and the photoresist-coated substrate.

In the embodiment illustrated in FIGS. 1A-1H, the first photoresist layer 30 is a positive-tone resist. In some embodiments where a majority of the surface of the photomask 45 is covered by the absorber layer 60, the photomask is termed a dark-field mask, and the resulting exposure is termed a dark-field exposure.

After the selective exposure of the first photoresist layer 30, the first photoresist layer 30 is developed using a suitable developer forming a patterned photoresist layer having one or more openings exposing an underlying layer. Using the patterned photoresist layer 30 as a mask, the openings in the photoresist layer 30 are extended into an underlying layer, such as the hard mask layer 25, using a suitable etching operation forming an opening 40 in the hard mask layer, as shown in FIG. 1B. After the hard mask layer 25 is patterned, the first photoresist layer 30 is removed by a suitable etching or photoresist stripping operation, as shown in FIG. 1C. In some embodiments, the first photoresist layer 30 is removed by an oxygen plasma etching operation.

A second photoresist layer 65 is subsequently formed over the patterned hard mask layer 25, as shown in FIG. 1D. When the first photoresist layer 30 is made of a positive-tone resist the second photoresist layer 65 is made of a negative-tone resist. The second photoresist layer 65 undergoes a first baking (or pre-exposure baking) operation to evaporate solvents in the resist composition in a first pre-exposure baking operation in some embodiments. Then, a second selective exposure to actinic radiation is performed, as shown in FIG. 1E. In some embodiments, the second selective exposure of the second photoresist layer 65 to form exposed regions 65' and unexposed regions 65 is performed using extreme ultraviolet lithography. In other embodiments, the second selective exposure to actinic radiation is performed with deep UV radiation or an electron beam. As explained in reference to FIG. 1A, a reflective photomask is used to form the patterned exposure light in extreme ultraviolet lithography in some embodiments. The reflective photomask 75 used in the second selective exposure has a different absorber layer 60 pattern than the first reflective photomask 45. In some embodiments, the second photoresist layer 65 undergoes a post-exposure baking (PEB) operation after the selective exposure to actinic radiation 35b to further the chemical reaction occurring in the exposed regions 65' before developing the selectively exposed second photoresist layer.

In some embodiments where a majority of the surface of the photomask 75 is not covered by the absorber layer 60, the photomask is termed a bright-field mask, and the resulting exposure is termed a bright-field exposure.

After the selective exposure of the second photoresist layer 65, the second photoresist layer 65 is developed using a suitable developer forming a patterned photoresist layer having one or more openings exposing an underlying layer. Using the patterned second photoresist layer 65' as a mask, the openings in the second photoresist layer 65' are extended into an underlying layer, such as the hard mask layer 25, using a suitable etching operation forming an opening 80 in the hard mask layer, as shown in FIG. 1F. Then, the second photoresist layer 65' is removed by a suitable etching or photoresist stripping operation, as shown in FIG. 1G. In some embodiments, the second photoresist layer 65' is removed by an oxygen plasma etching operation.

Then, the openings in the hard mask layer 25 are extended into the target layer 20 using a suitable etching operation as shown in FIG. 1H.

FIGS. 2A-2H illustrate a process flow 200 of manufacturing a semiconductor device according to embodiments of the disclosure. In some embodiments, a target layer 20 is formed over a substrate 15, as shown in FIG. 2A. In some embodiments, one or more layers are formed between the substrate 15 and the target layer 20. A hard mask layer 25 is formed over the surface of the target layer 20 in some embodiments or, when the target layer 20 not formed, over the surface of the substrate 10. A negative-tone resist layer 65 is subsequently formed over the hard mask layer 25 in some embodiments. In other embodiments, the negative-tone resist layer 65 is formed directly over the target layer 20. The negative-tone resist layer 65 undergoes a first baking (or pre-exposure baking) operation to evaporate solvents in the resist composition in a pre-exposure baking operation in some embodiments.

In some embodiments, the selective exposure of the negative-tone photoresist layer 65 to form exposed regions 65' and unexposed regions 65 is performed using extreme ultraviolet lithography. In other embodiments, deep ultraviolet (DUV) radiation or electron beam is used to selectively expose the negative-tone resist photoresist layer 65. A reflective photomask 75 is used to form the patterned exposure light in extreme ultraviolet lithography in some embodiments. As explained in reference to FIG. 1E, in some embodiments, the photomask 75 is a bright-field mask, and the resulting exposure is a bright-field exposure. In some embodiments, the second photoresist layer 65 undergoes a post-exposure baking (PEB) operation after the selective exposure to actinic radiation 35b to further the chemical reaction occurring in the exposed regions 65' before developing the selectively exposed negative-tone photoresist layer.

After the selective exposure of the negative-tone photoresist layer 65, the negative-tone photoresist layer 65 is developed using a suitable developer forming a patterned photoresist layer having one or more openings exposing an underlying layer. Using the patterned photoresist layer 65' as a mask, the openings in the photoresist layer 65' are extended into an underlying layer, such as the hard mask layer 25, using a suitable etching operation forming an opening 80 in the hard mask layer, as shown in FIG. 2B. After the hard mask layer 25 is patterned, the negative-tone photoresist layer 65' is removed by a suitable etching or photoresist stripping operation, as shown in FIG. 2C. In some embodiments, the negative-tone photoresist layer 65' is removed by an oxygen plasma etching operation.

A positive-tone photoresist layer 30 is subsequently formed over the patterned hard mask layer 25, as shown in FIG. 2D. In some embodiments, the positive-tone photoresist layer 30 undergoes a pre-exposure baking operation to drive off solvents in the photoresist layer. Then a second selective exposure to actinic radiation is performed, as shown in FIG. 2E. In some embodiments, the second selective exposure of the positive-tone photoresist layer 30 to form exposed regions 30' and unexposed regions 30 is performed using extreme ultraviolet lithography. In other embodiments, DUV radiation or electron beam is used to selectively expose the positive-tone photoresist layer. As explained in reference to FIG. 2A, a reflective photomask is used to form the patterned exposure light in extreme ultraviolet lithography in some embodiments. The second reflective photomask 45 used in the second selective exposure has a different absorber layer 60 pattern than the first reflective photomask 75. In some embodiments, the second selective exposure is performed using a dark-field mask, and the resulting exposure is a dark-field exposure.

After the selective exposure of the positive-tone photoresist layer 30, the positive-tone photoresist layer 30 is developed using a suitable developer forming a patterned photoresist layer having one or more openings exposing an underlying layer. Using the patterned positive-tone photoresist layer 30 as a mask, the openings in the positive-tone photoresist layer 30 are extended into an underlying layer, such as the hard mask layer 25, using a suitable etching operation forming an opening 40 in the hard mask layer, as shown in FIG. 2F. Then, the positive-tone photoresist layer 30 is removed by a suitable etching or photoresist stripping operation, as shown in FIG. 2G. In some embodiments, the positive-tone photoresist layer 30 is removed by an oxygen plasma etching operation.

Then, the openings in the hard mask layer 25 are extended into the target layer 20 using a suitable etching operation as shown in FIG. 2H.

According to embodiments of the disclosure, the substrate 15 includes a single crystalline semiconductor layer on at least it surface portion. The substrate 15 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 15 is a silicon layer of an SOI (silicon-on insulator) substrate. In certain embodiments, the substrate 15 is made of crystalline Si. In some embodiments, the substrate 15 is a Si wafer.

The substrate 15 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 15. The germanium concentration of the SiGe buffer layers may increase from 30 atomic % for the bottom-most buffer layer to 70 atomic % for the top-most buffer layer.

In some embodiments, the substrate 15 includes at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 15 includes titanium, aluminum, cobalt, ruthenium, titanium nitride, tungsten nitride, tantalum nitride, and combinations thereof.

In some embodiments, the substrate 15 includes a dielectric having at least silicon, metal oxide, and metal nitride of the formula $MX_b$, where M is a metal or Si, X is N or O, and b ranges from about 0.4 to about 2.5. In some embodiments, the substrate 15 includes silicon dioxide, silicon nitride, aluminum oxide, hafnium oxide, lanthanum oxide, and combinations thereof.

In some embodiments, the hard mask layer 25 is a silicon or metal oxide or nitride. In some embodiments, the hard mask layer is a silicon oxide, a silicon nitride, an aluminum oxide, an aluminum nitride, titanium, titanium nitride, tungsten nitride, tantalum, tantalum oxide, tantalum nitride, spin-on carbon, and combinations thereof. In some embodiments, the hard mask layer 25 is formed by physical vapor deposition (PVD), chemical vapor deposition (CVD), or atomic layer deposition (ALD). In some embodiments, the hard mask layer 25 is formed by sputtering, plasma-enhanced atomic layer deposition (PE-ALD), plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD). In some embodiments, the thickness of the hard mask layer 25 ranges from about 1 nm to about 50 nm.

In some embodiments, the target layer 20 includes an inter-layer dielectric layer (ILD) or a low-k dielectric layer. In some embodiments, the target layer is made of a silicon oxide, silicon nitride, SiON, SiCN, SiOC, spin-on glass (SOG), a fluorosilicate glass, an organosilicate glass, a spin-on organic polymer dielectric, and a spin-on silicon based polymeric dielectric. In some embodiments, the thickness of the target layer ranges from about 10 nm to about 200 nm.

In some embodiments, suitable etching techniques for etching the hard mask layer 25 and the target layer 20 include dry etching, including plasma based etching, and wet etching techniques. In some embodiments, the hard mask layer 25 is etched by a dry etching operation using one or more of $Cl_2$, $Ar/CHF_3$, $Ar/Cl_2$, and $Ar/BCl_3$ as etching gasses. In some embodiments, the target layer 20 is etched by a dry etching operation using one or more of $CF_4$, $CH_2F_2$, $CHF_3$, and $C_4F_8$ as etching gasses. In some embodiments, CO is added to the plasma source gas.

In some embodiments, the first or second resist layers 30, 65 include a chemically-amplified resist (CAR) composition. In some embodiments, the first or second resist layers 30, 65 include a polymethylmethacrylate (PMMA) or a polyhydroxystyrene (PHS). In some embodiments, the first or second resist layers are formed by a spin-coating method. In other embodiments, the first or second resist layers 30, 65 include a metal-containing photoresist formed by chemical vapor deposition (CVD) or atomic layer deposition (ALD). In some embodiments, the metal-containing photoresist layer is formed by a spin-coating method.

Photoresists used in the first and second photoresist layers 30, 65 according to the present disclosure include a polymer along with one or more photoactive compounds (PACs) in a solvent, in some embodiments. In some embodiments, the polymer includes a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In some embodiments, the hydrocarbon structure includes a repeating unit that forms a skeletal backbone of the polymer. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer having acid labile groups selected from the following:

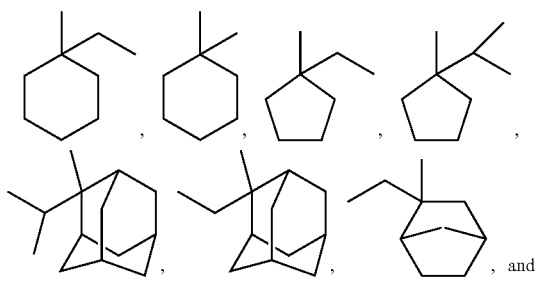

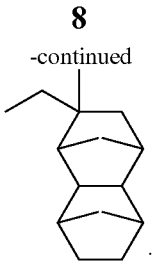

-continued

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decomposes attached to the hydrocarbon structure so that it will react with the acids/bases/free radicals generated by the PACs during exposure. Groups that react with acids are known as acid labile groups. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiments, the acid labile group (ALG) decomposes by the action of the acid generated by the photoacid generator leaving a carboxylic acid group pendant to the polymer resin chain, as shown in the ALG de-protect reaction:

ALG de-protect reaction

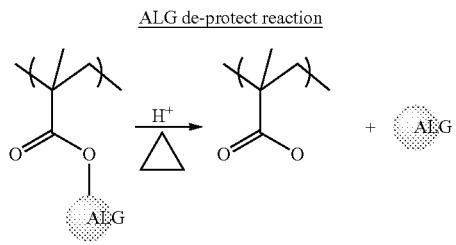

In some embodiments, the polymer also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Optionally, the polymer includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like. In some embodiments, the photoresist composition includes one or more photoactive compounds (PAC).

In some embodiments, the PACs include photoacid generators, photobase generators, photo decomposable bases, free-radical generators, or the like. In some embodiments in which the PACs are photoacid generators, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

The photoresist compositions may also include a number of other additives that assist the photoresist to obtain high resolution. For example, some embodiments of the photoresist also includes surfactants in order to help improve the ability of the photoresist to coat the surface on which it is applied. Another additive added to some embodiments of the photoresist composition is a quencher, which inhibits diffusion of the generated acids/bases/free radicals within the photoresist. The quencher improves the resist pattern configuration as well as the stability of the photoresist over time. Other additive added to some embodiments of the photoresist is a stabilizer, which assists in preventing undesired diffusion of the acids generated during exposure of the photoresist; a dissolution inhibitor to help control dissolution of the photoresist during development; a plasticizer, to reduce delamination and cracking between the photoresist and underlying layers (e.g., the layer to be patterned); and an adhesion promoter.

In some embodiments, the first or second photoresist layers 30, 65 are made of a photoresist composition, including a first compound or a first precursor and a second compound or a second precursor combined in a vapor state. The first precursor or first compound is an organometallic having a formula: $M_a R_b X_c$, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1 \leq a \leq 2$, $b \geq 1$, $c \geq 1$, and $b+c \leq 5$ in some embodiments. In some embodiments, the alkyl, alkenyl, or carboxylate group is substituted with one or more fluoro groups. In some embodiments, the organometallic precursor is a dimer, where each monomer unit is linked by an amine group. Each monomer has a formula: $M_a R_b X_c$, as defined above.

In some embodiments, R is alkyl, such as $C_n H_{2n+1}$ where $n \geq 3$. In some embodiments, R is fluorinated, e.g., having the formula $C_n F_x H_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

In some embodiments, the first organometallic compound or first organometallic precursor includes a metallic core $M^+$ with ligands L attached to a metallic core $M^+$. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, or n-propyl tris(butoxy) tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_p H_n X_m$, where $0 \leq n \leq 3$, $0 \leq m \leq 3$, $n+m=3$ when p is 1, and $n+m=4$ when p is 2, and each X is independently a halogen selected from the group consisting of F, Cl, Br, and I. In some embodiments, the borane has a formula $B_p H_n X_m$, where $0 \leq n \leq 3$, $0 \leq m \leq 3$, $n+m=3$ when p is 1, and $n+m=4$ when p is 2, and each X is independently a halogen selected from the group consisting of F, Cl, Br, and I. In some embodiments, the phosphine has a formula $P_p H_n X_m$, where $0 \leq n \leq 3$, $0 \leq m \leq 3$, $n+m=3$, when p is 1, or $n+m=4$ when p is 2, and each X is independently a halogen selected from the group consisting of F, Cl, Br, and I.

In some embodiments, the depositing of the metallic photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

In some embodiments, the thickness of the photoresist layers disclosed herein range from about 5 nm to about 100 nm in some embodiments, and from about 10 nm to about 50 nm in other embodiments.

In some embodiments, the pre-exposure bake of the photoresist layers disclosed herein are performed at a temperature and time sufficient to cure and dry the resist layers. In some embodiments, the resist layers are heated at a temperature of about 40° C. and 120° C. for about 10 seconds to about 10 minutes. In some embodiments, the post-exposure bake of the photoresist resist layers disclosed herein include heating the resist layers at a temperature of about 50° C. to about 250° C. for about 20 seconds to about 300 seconds.

In some embodiments, the selectively exposed photoresist layers are developed by applying a developer to the photoresist layers using a spin-on process. In the spin-on process, the developer is applied to the photoresist layers from above the photoresist layers while the photoresist coated substrate is rotated. In some embodiments, the developer is supplied at a rate of between about 5 ml/min and about 800 ml/min, while the photoresist coated substrate is rotated at a speed of between about 100 rpm and about 2000 rpm. In some embodiments, the developer is at a temperature of between about 20° C. and about 75° C. during the development operation. The development operation continues for between about 10 seconds to about 10 minutes in some embodiments.

While the spin-on operation is one suitable method for developing the photoresist layers after exposure, it is intended to be illustrative and is not intended to limit the embodiment. Rather, any suitable development operations, including dip processes, puddle processes, and spray-on methods, may alternatively be used. All such development operations are included within the scope of the embodiments.

Development is performed using a solvent. In some embodiments where positive-tone development is desired, a positive-tone developer such as a basic aqueous solution is used. In some embodiments, the positive-tone developer includes one or more selected from tetramethylammonium hydroxide (TMAH), tetrabutylammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, potassium metasilicate, tetraethylammonium hydroxide, combinations of these, or the like.

In some embodiments where negative-tone development is desired, an organic solvent or critical fluid is used to remove the unexposed regions of the photoresist. In some embodiments, the negative-tone developer includes one or more selected from hexane, heptane, octane, toluene, xylene, dichloromethane, chloroform, carbon tetrachloride, trichloroethylene, and like hydrocarbon solvents; critical carbon dioxide, methanol, ethanol, propanol, butanol, and like alcohol solvents; diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether and like ether solvents; acetone, methyl ethyl ketone, methyl isobutyl ketone, isophorone, cyclohexanone and like ketone solvents; methyl acetate, ethyl acetate, propyl acetate, butyl acetate and like ester solvents; pyridine, formamide, and N,N-dimethyl formamide or the like.

After developing, remaining developer is removed from the patterned photoresist covered substrate. The remaining developer is removed using a spin-dry process in some embodiments, although any suitable removal technique may be used.

According to embodiments of the disclosure, the absorber layer 60 of photomasks according to embodiments of the disclosure is made of a material selected from the group consisting of B, Sn, Ni, Ta, Te, Co, In, Sb, and alloys, oxides, and nitrides thereof. In some embodiments, the absorber layer 60 is made of a material selected from the group consisting of B, Sn, Ni, Ta, Te, and alloys, oxides, and nitrides thereof. In some embodiments, the absorber layer 60 is made of TaBN or TaBO. In some embodiments, the absorber layer 60 has a coefficient of extinction ranging from about 0.065 to about 0.105. In some embodiments, the thickness of the absorber layer 60 ranges from about 20 nm to about 70 nm depending on the absorber layer material.

The amount of actinic radiation, to which the photoresist layers disclosed herein are exposed, can be characterized by a fluence or dose, which is obtained by the integrated radiative flux over the exposure time. Suitable radiation fluences range from about 1 mJ/cm$^2$ to about 150 mJ/cm$^2$ in some embodiments, from about 2 mJ/cm$^2$ to about 100 mJ/cm$^2$ in other embodiments, and from about 3 mJ/cm$^2$ to about 50 mJ/cm$^2$ in other embodiments. A person of ordinary skill in the art will recognize that additional ranges of radiation fluences within the explicit ranges above are contemplated and are within the present disclosure.

In some embodiments, the photoresist is selectively exposed to XUV radiation having a wavelength ranging from about 0.1 nm to about 100 nm. The EUV/XUV radiation source is a laser excited tin plasma in some embodiments. The radiation from the laser excited tin plasma is filtered in some embodiments to provide a desired exposure wavelength (e.g., 13.5 nm or 50 nm).

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 µC/cm$^2$ to about 5 µC/cm$^2$ in some embodiments, from about 0.5 µC/cm$^2$ to about 1 µC/cm$^2$ in other embodiments, and in other embodiments from about 1 µC/cm$^2$ to about 100 µC/cm$^2$. A person of ordinary skill in the art can compute corresponding doses at other beam energies based on the teachings herein and will recognize that additional ranges of electron beam properties within the explicit ranges above are contemplated and are within the present disclosure.

FIGS. 3A-3G illustrate a process flow 300 of manufacturing a semiconductor device according to embodiments of the disclosure. In some embodiments, a layer to be patterned (or a target layer) 20 is formed over a substrate 15, as shown in FIG. 3A. In some embodiments, one or more layers are formed between the substrate 15 and the target layer 20. In some embodiments, the one or more layers formed between the substrate 15 and the target layer includes semiconductor devices, such as field effect transistors, resistors, capacitors, and inductors. A hard mask layer 25 is formed over the surface of a layer to be patterned (or target layer) 20 in some embodiments or, when the target layer 20 not formed, over the surface of the substrate 15. A first resist layer 30 is subsequently formed over the hard mask layer 25 in some embodiments. In other embodiments, the first resist layer 30 is formed directly over the target layer 20. The first resist layer 30 undergoes a first baking (or pre-exposure baking) operation to evaporate solvents in the resist composition in some embodiments. In some embodiments, the first resist layer 30 is a positive-tone photoresist.

In some embodiments, the first resist layer 30 is selectively exposed to actinic radiation, as shown in FIG. 3B. In some embodiments, the actinic radiation is DUV or XUV radiation or an electron beam. A reflective photomask 85 is used to form the patterned exposure light in extreme ultraviolet lithography in some embodiments. The reflective photomask 85 may be formed of the same materials as the other reflective photomasks disclosed herein with respect to FIGS. 1A, 1E, 2A, and 2E.

The first photoresist layer 30 is selectively exposed to actinic radiation to form exposed regions 30' and unexposed regions 30. In some embodiments, the first photoresist layer 30 undergoes a post-exposure baking (PEB) operation after the selective exposure to actinic radiation 35b to further the chemical reaction occurring in the exposed regions 30' before developing the selectively exposed first photoresist layer.

After the selective exposure of the first photoresist layer 30, the first photoresist layer 30 is developed using a suitable developer forming a patterned photoresist layer exposing an underlying layer, as shown in FIG. 3C. Then, as shown in FIG. 3D, the portions of the first photoresist layer 30 removed during the development operation are filled with a second photoresist layer 65 that has an opposite tone than the first photoresist layer. For example, if the first photoresist layer 30 is a positive tone photoresist then the second photoresist layer 65 is a negative tone photoresist or vice versa. Thus, a substrate coated with two different tone photoresists at a same level is provided. In some embodiments, the upper surface of the first photoresist layer 30 and the second photoresist layer 65 is substantially coplanar. In some embodiments, a dry deposition technique is used to coat the second photoresist layer 65 over both the hard mask layer 25 and the first photoresist layer 30, and then a planarization operation, such as chemical-mechanical polishing (CMP) is performed to planarize the first photoresist layer 30 and the second photoresist layer 65. In other embodiments, the second photoresist layer 65 is selectively deposited only over the hard mask layer 25.

The substrate coated with two different tone photoresists at a same level is subsequently selectively exposed to actinic radiation 35a in a second exposure operation, as shown in FIG. 3E to form exposed regions of the first photoresist layer 30' and the second photoresist layer 65'. In some embodiments, the actinic radiation is XUV radiation, and the second exposure operation is performed using a reflective photomask 90 having a different absorber layer 60 pattern formed thereon than the reflective photomask 85 shown in FIG. 3B.

After the second selective exposure of the first photoresist layer 30 and the second photoresist layer 65, the first photoresist layer 30 and second photoresist layer 65 are developed using one or more suitable developers forming openings 40, 80 in the first and second photoresist layers 35, 65, as shown in FIG. 3F. After the developing operation, the actinic radiation unexposed regions 30 of the positive-tone photoresist layer and the actinic radiation exposed regions 65' of the negative-tone photoresist layer remain. The openings 40, 80 expose portions of the underlying layer 25. Using the patterned photoresist layers 30, 65' as a mask, the openings in the photoresist layers 30, 65 are extended into an underlying layer 25, such as the hard mask layer, using a suitable etching operation. The pattern in the hard mask layer 25 is subsequently extended into the target layer 20 forming openings 40', 80', as shown in FIG. 3G. After the hard mask layer 25 is patterned, the first and second photoresist layers 30, 65' are removed by suitable etching or photoresist stripping operations. In some embodiments, the first and second photoresist layers 30, 65' are removed by an oxygen plasma etching operation.

FIGS. 4A-4G illustrate a process flow 400 of manufacturing a semiconductor device according to embodiments of the disclosure. In some embodiments, a layer to be patterned (or a target layer) 20 is formed over a substrate 15, as shown in FIG. 4A. In some embodiments, one or more layers are formed between the substrate 15 and the target layer 20. In some embodiments, the one or more layers formed between the substrate 15 and the target layer 20 includes semiconductor devices, such as field effect transistors, resistors, capacitors, and inductors. A hard mask layer 25 is formed over the surface of a layer to be patterned (or target layer) 20 in some embodiments or, when the target layer 20 not formed, over the surface of the substrate 15. A negative-tone resist layer 65 is subsequently formed over the hard mask layer 25 in some embodiments. In other embodiments, the negative-tone resist layer 65 is formed directly over the target layer 20. The negative-tone resist layer 65 undergoes a first baking (or pre-exposure baking) operation to evaporate solvents in the resist composition in some embodiments.

In some embodiments, the negative-tone resist layer 65 is selectively exposed to actinic radiation, as shown in FIG. 4B. In some embodiments, the actinic radiation is DUV or XUV radiation or an electron beam. A reflective photomask 95 is used to form the patterned exposure light in extreme ultraviolet lithography in some embodiments. The reflective photomask 95 may be formed of the same materials as the other reflective photomasks disclosed herein with respect to FIGS. 1A, 1E, 2A, 2E, 3A, and 3E.

The negative-tone photoresist layer 65 is selectively exposed to actinic radiation to form exposed regions 65' and unexposed regions 65. In some embodiments, the negative-tone photoresist layer 65, 65' undergoes a post-exposure baking (PEB) operation after the selective exposure to actinic radiation 35b to further the chemical reaction occurring in the exposed regions 65' before developing the selectively exposed negative-tone photoresist layer.

After the selective exposure of the negative-tone photoresist layer 65, the negative-tone photoresist layer 65 is developed using a suitable developer forming a patterned photoresist layer exposing an underlying layer, as shown in FIG. 4C. Then, as shown in FIG. 4D, the portions of the negative-tone photoresist layer removed during the development operation are filled with a positive-tone photoresist layer 30. In some embodiments, the positive-tone photoresist layer 30 undergoes a pre-exposure baking operation. Thus, a substrate coated with a negative-tone photoresist and a positive-tone photoresist at a same level is provided.

The substrate coated with the two different tone photoresists at a same level is subsequently selectively exposed to actinic radiation in a second exposure operation, as shown in FIG. 4E to form exposed regions of the first photoresist layer 30' and the second photoresist layer 65'. In some embodiments, the actinic radiation is XUV radiation, and the second exposure operation is performed using a reflective photomask 105 having a different absorber layer 60 pattern formed thereon than the reflective photomask 95 shown in FIG. 4B. Because the exposed regions of the negative-tone photoresist layer 65' have already been exposed to actinic radiation during the first exposure operation, the second exposure to actinic radiation has no additional effect on the previously exposed regions of the negative-tone photoresist layer in some embodiments. In some embodiments, the positive-tone photoresist layer and the negative-tone photoresist layer undergo a post exposure baking operation after the second exposure to actinic radiation.

After the second selective exposure of the first photoresist layer 30 and the second photoresist layer 65', the first photoresist layer 30 and second photoresist layer 65' are developed using a suitable developer forming openings 40, 80 in the first and second photoresist layers 35, 65', as shown in FIG. 4F. After the developing operation, the actinic radiation unexposed regions 30 of the positive-tone photoresist layer and the actinic radiation exposed regions 65' of the negative-tone photoresist layer remain. The openings 40, 80 expose portions of the underlying layer 25. Using the patterned photoresist layers 30, 65' as a mask, the openings in the photoresist layers 30, 65 are extended into an underlying layer 25, such as the hard mask layer, using a suitable etching operation. The pattern in the hard mask layer 25 is subsequently extended into the target layer 20 forming openings 40', 80', as shown in FIG. 4G. After the hard mask layer 25 is patterned, the first and second photoresist layers 30, 65' are removed by suitable etching or photoresist stripping operations. In some embodiments, the first and second photoresist layers 30, 65' are removed by an oxygen plasma etching operation.

Figure 5A:
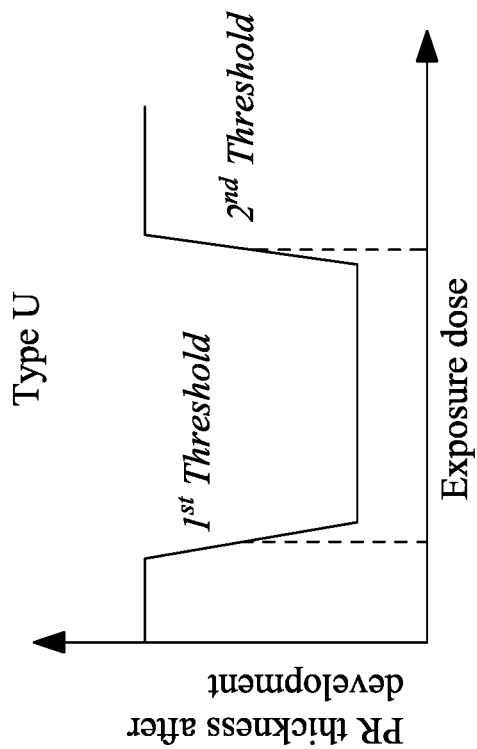

FIGS. 5A and 5B illustrate the photoresist development thresholds for amphoteric photoresists according to embodiments of the disclosure. Amphoteric photoresists according to embodiments of the disclosure include Type U and Type Π photoresists. Both Type U and Type Π photoresists have at least two development thresholds. As shown in FIG. 5A, at an exposure dose below a first threshold, substantial development does not occur for a Type U amphoteric photoresist. When the exposure dose exceeds the first threshold, the Type U amphoteric photoresist undergoes a chemical reaction increasing the solubility of the amphoteric photoresist in the developer. The Type U amphoteric photoresist has a second development threshold, where at an exposure dose greater than the second threshold, substantial development does not occur. In other words, the development rates for the Type U amphoteric photoresist as the exposure dose increases is low to high to low, as shown in FIG. 5A.

An example of a Type U amphoteric photoresist is a tin-oxo cage $[(BuSn)_{12}O_{14}(OH)_6](OH)_2$ photoresist. $[(BuSn)_{12}O_{14}(OH)_6](OH)_2$ has the following structure:

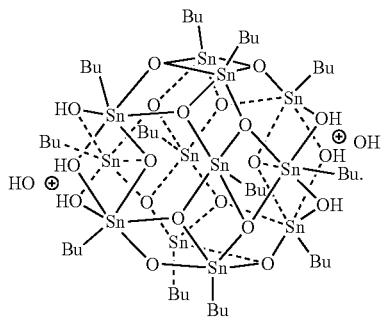

The tin-oxo cage $[(BuSn)_{12}O_{14}(OH)_6](OH)_2$ is dissolved in an organic solvent, such as toluene, in some embodiments, applied to a substrate, and a pre-exposure bake to remove the residual solvent is performed. After selective exposure to actinic radiation, a post-exposure bake is performed in some embodiments and the tin-oxo cage $[(BuSn)_{12}O_{14}(OH)_6](OH)_2$ photoresist is subsequently developed using an isopropanol/water solution.

As shown in FIG. 5B, at an exposure dose below a first threshold substantial development of the Type Π amphoteric photoresist occurs. When the exposure dose exceeds the first threshold, the development rate of the Type Π of the substantially decreases. In some embodiments, when exposure dose exceeds the first threshold, development of the amphoteric photoresist substantially ceases. The Type Π amphoteric photoresist has a second development threshold, where at an exposure dose greater than the second threshold, substantial development occurs. In other words, the development rates for the Type Π amphoteric photoresist as the exposure dose increases is high to low to high, as shown in FIG. 5B.

An example of a Type Π amphoteric photoresist is a $La_{0.6}Ca_{0.4}MnO_3$ resist. The $La_{0.6}Ca_{0.4}MnO_3$ is applied to a substrate by spin-coating in an aqueous solution in some embodiments. After selective exposure to actinic radiation, the $La_{0.6}Ca_{0.4}MnO_3$ photoresist is developed using pure water.

FIGS. 6A-6F illustrate a process flow 500 of manufacturing a semiconductor device according to embodiments of the disclosure. In some embodiments, a layer to be patterned (or a target layer) 20 is formed over a substrate 15, as shown in FIG. 6A. In some embodiments, one or more layers are formed between the substrate 15 and the target layer 20. In some embodiments, the one or more layers formed between the substrate 15 and the target layer includes semiconductor devices, such as field effect transistors, resistors, capacitors, and inductors. A hard mask layer 25 is formed over the surface of a layer to be patterned (or target layer) 20 in some embodiments or, when the target layer 20 not formed, over the surface of the substrate 15.

An amphoteric photoresist layer 110 is subsequently formed over the hard mask layer 25 in some embodiments. In this embodiment, the amphoteric photoresist layer is formed from a Type U amphoteric photoresist. In other embodiments, the amphoteric photoresist layer 110 is formed directly over the target layer 20. The Type U amphoteric photoresist layer 110 undergoes a first baking (or pre-exposure baking) operation to evaporate solvents in the resist composition in some embodiments.

In some embodiments, the Type U amphoteric photoresist layer 110 is selectively exposed to actinic radiation, as shown in FIG. 6B. In some embodiments, the actinic radiation is DUV or XUV radiation or an electron beam. A reflective photomask 120 is used to form the patterned exposure light in extreme ultraviolet lithography in some embodiments. The reflective photomask 120 may be formed of the same materials as the other reflective photomasks disclosed herein with respect to FIGS. 1A, 1E, 2A, 2E, 3A, 3E, 4A, and 4E.

The reflective photomask 120 is a tri-tone photomask in some embodiments. The tri-tone photomask includes darkfield areas 60a where the absorber layer 60 absorbs substantially all the incident radiation 35a, bright-field areas 60c where a substantial amount of the incident radiation 35a is reflected off the multilayer 55 towards the photoresist layer 110, and gray-field areas 60b where the absorber layer 60 absorbs a portion of the incident radiation 35a and the multilayer 55 reflects a portion of the incident radiation 35a towards the photoresist layer 110.

Figure 6G:
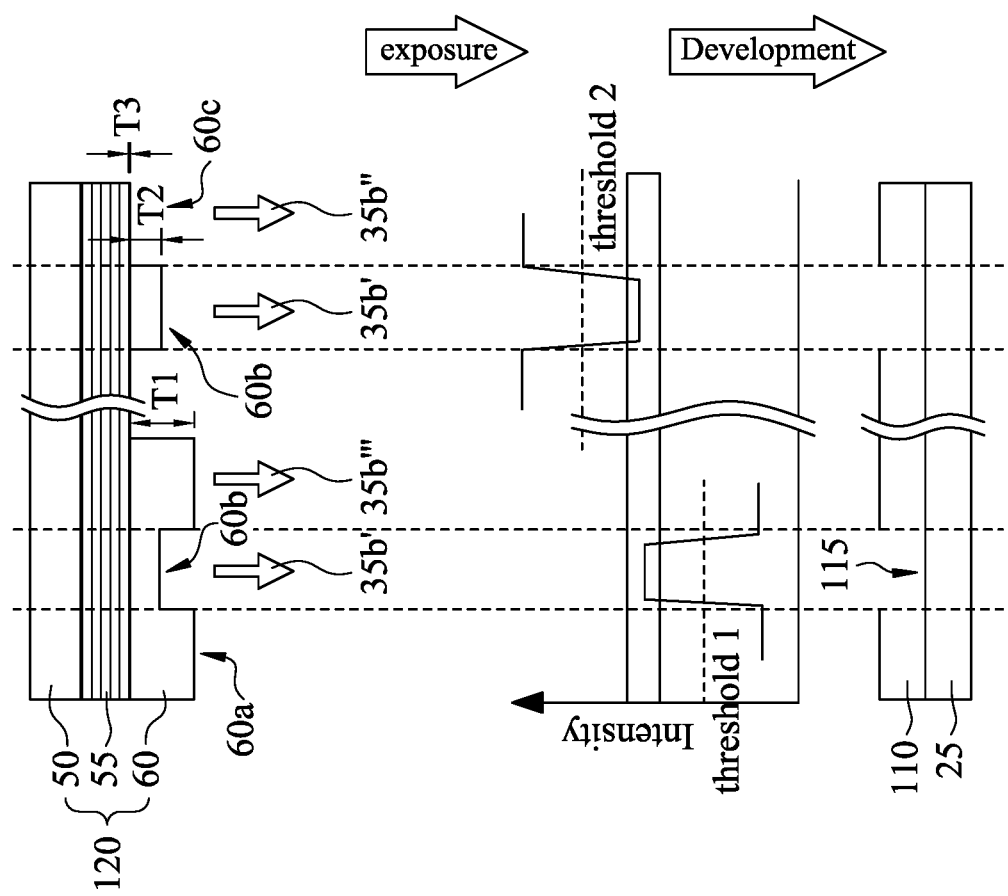
FIG. 6G illustrates the exposure and development of an amphoteric resist according to embodiments of the disclosure.

In some embodiments, the amount of incident radiation 35a that is absorbed or reflected depends on the thickness of the absorber layer 60. As shown in FIG. 6B, the dark-field area 60a of the absorber layer 60 is thicker than the gray field area 60b and the gray-field area 60b of the absorber layer 60 is thicker than the bright-field area 60c. In some embodiments, the absorber layer 60 is formed of the same material in the dark-field area 60a and the gray-field area 60b, and if there is any absorber layer material in the bright-field area 60c the absorber layer material is the same as in the gray-field area 60b and the dark-field area 60a. In some embodiments, the tri-tone photomask 120 has a first region 60a with a first absorber layer thickness T1, a second region 60b with a second absorber layer thickness T2, and a third region 60c with a third absorber layer thickness T3, wherein T1>T2>T3 (see FIG. 6G). In some embodiments, $0.67T1 \geq T2 \geq 0.33T1$. In some embodiments, $0.25T1 \geq T3 \geq 0$. In some embodiments, the thickness of the first region 60a is about 60 nm+/−20%.

Because of the different thicknesses of the absorber layer on the tri-tone photomask corresponding portions of the amphoteric photoresist layer 110 receive different exposure doses of actinic radiation. In some embodiments, a first region 110" of the Type U amphoteric resist layer 110 is exposed to a first exposure dose D1 of actinic radiation 35b, a second region 110' of the Type U amphoteric resist layer is exposed to a second dose D2 of the actinic radiation 35b, and a third region 110 of the Type U amphoteric resist layer is exposed to a third dose D3 of the actinic radiation, and D1>D2>D3. As shown in FIG. 6B, the first region 110", second region 110', and third region 110 are exposed during a same selective exposure operation by a same actinic radiation 35a beam impinging on a same photomask 120. In some embodiments, $0.67D1 \geq D2 \geq 0.33D1$. In some embodiments, $0.25D1 \geq D3 \geq 0$.

In some embodiments, the exposed amphoteric photoresist layer 110, 110', 110" undergoes a post-exposure baking (PEB) operation after the selective exposure to actinic radiation 35b before developing the selectively exposed amphoteric photoresist layer. The exposed amphoteric resist layer 110, 110', 110" is subsequently developed using a developer to form a pattern in the amphoteric photoresist layer. In some embodiments, openings 115 are formed in the amphoteric photoresist layer 110, 110" as shown in FIG. 6C.

Using the patterned photoresist layer 110, 110" as a mask, the openings 115 in the photoresist layer are extended into an underlying layer 25, such as the hard mask layer, forming openings 115' in the underlying layer using a suitable etching operation, as shown in FIG. 6D. In some embodiments, the patterned photoresist layer 110, 110" is removed using a suitable etching or photoresist stripping operation, as shown in FIG. 6E. The pattern in the hard mask layer 25 is subsequently extended into the target layer 20 forming openings 115", as shown in FIG. 6F, using a suitable etching operation.

FIG. 6G illustrates the radiation reflected off of the tri-tone photomask 120 in FIG. 6B, the sensitivity of the amphoteric photoresist layer to the various exposure doses reflected off the tri-tone photomask, and the corresponding pattern formed in the selectively exposed photoresist layer 110, 110" after development. As shown in FIG. 6G, the tri-tone photomask reflects three different doses (intensities) of actinic radiation. The highest dose D1 of reflected radiation 35b" is reflected from the regions 60c where the absorber layer 60 is the thinnest or non-existent. An intermediate dose D2 of reflected radiation 35b' is reflected from the regions 35b' where the absorber layer has an intermediate thickness T2. A lowest dose D3 of reflected radiation 35b''', including substantially no reflected radiation, is reflected from the regions 60a where the absorber layer 60 has the greatest thickness T1. The left side of the photomask 120 provides a dark-field exposure and the right side of the photomask 120 provides a bright-field exposure. In some embodiments, the dark-field exposure is used to expose portions of the photoresist layer 110 where pattern features having a larger pitch are formed and the bright-field exposure is used to expose portions of the photoresist layer 110 where pattern features having a smaller pitch are formed. For example, in some embodiments, the dark-field exposure is used to form pattern features having a pitch of about 35 nm or more and the bright-field exposure is used to form pattern features having a pitch of about 20 nm or less.

As shown in FIG. 6G, when the exposure dose exceeds the first threshold, the Type U amphoteric photoresist undergoes a chemical reaction changing the solubility of the amphoteric photoresist to the developer. The Type U amphoteric photoresist has a second development threshold, where at an exposure dose greater than the second threshold substantial development does not occur, as shown for the bright-field exposure in FIG. 6G. In some embodiments, when the dose D3 is smaller than the first threshold, the dose D2 is greater than the first threshold and smaller than the second threshold, and the first dose D1 is greater than the second threshold, the combination of dark-field exposure and bright-field exposure produces the photoresist pattern shown in FIG. 6G.

Figure 7:
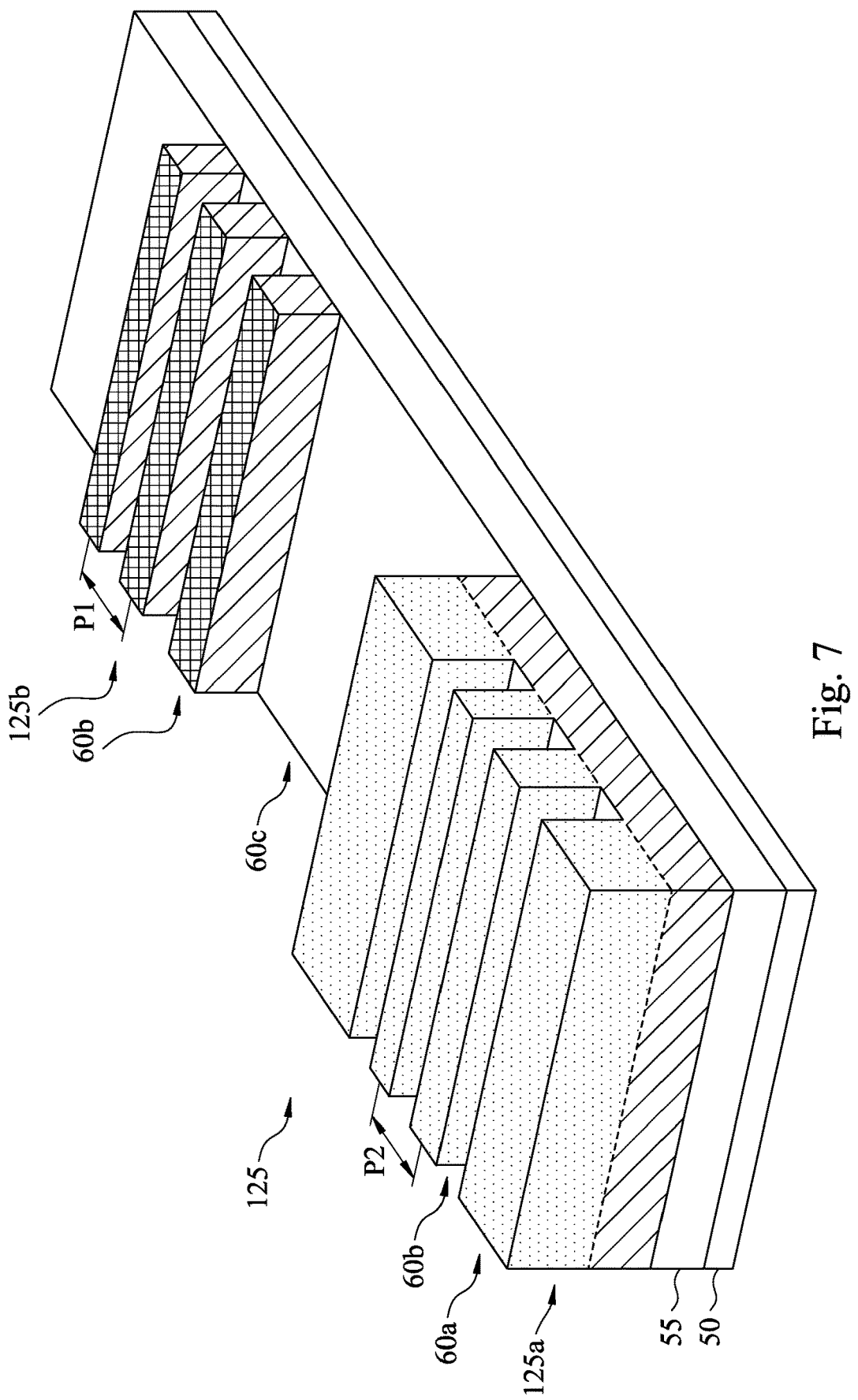
FIG. 7 illustrates a tri-tone photomask according to an embodiment of the disclosure.

FIG. 7 is an illustration of a tri-tone photomask 125 having dark-field exposure regions 125a and bright-field exposure regions 125b. In some embodiments, the pitch P2 of the pattern features in the dark-field exposure regions 125a is greater than the pitch P1 of the pattern features in the bright-field exposure regions 125b. In some embodiments, the tri-tone photomask 125 is different from a phase shift photomask.

FIGS. 8A-8F illustrate a process flow 600 of manufacturing a semiconductor device according to embodiments of the disclosure. In some embodiments, a layer to be patterned (or a target layer) 20 is formed over a substrate 15, as shown in FIG. 8A. In some embodiments, one or more layers are formed between the substrate 15 and the target layer 20. In some embodiments, the one or more layers formed between the substrate 15 and the target layer includes semiconductor devices, such as field effect transistors, resistors, capacitors, and inductors. A hard mask layer 25 is formed over the surface of a layer to be patterned (or target layer) 20 in some embodiments or, when the target layer 20 not formed, over the surface of the substrate 15.

An amphoteric photoresist layer 130 is subsequently formed over the hard mask layer 25 in some embodiments. In this embodiment, the amphoteric photoresist layer is formed from a Type Π amphoteric photoresist. In other embodiments, the Type Π amphoteric photoresist 130 is formed directly over the target layer 20. The Type Π amphoteric photoresist layer 130 undergoes a first baking (or pre-exposure baking) operation to evaporate solvents in the resist composition in some embodiments.

In some embodiments, the amphoteric photoresist layer 130 is selectively exposed to actinic radiation, as shown in FIG. 8B. In some embodiments, the actinic radiation is DUV or XUV radiation or an electron beam. A reflective photomask 135 is used to form the patterned exposure light in extreme ultraviolet lithography in some embodiments. The reflective photomask 135 may be formed of the same materials as the other reflective photomasks disclosed herein with respect to FIGS. 1A, 1E, 2A, 2E, 3A, 3E, 4A, 4E, and 6B.

The reflective photomask 135 is a tri-tone photomask in some embodiments. The tri-tone photomask includes dark-field areas 60a where the absorber layer 60 absorbs substantially all the incident radiation 35a, bright-field areas 60c where a substantial amount of the incident radiation 35a is reflected off the multilayer 55 towards the photoresist layer 130, and gray-field areas 60b where the absorber layer 60 absorbs a portion of the incident radiation 35a and the multilayer 55 reflects a portion of the incident radiation 35a towards the photoresist layer 130.

Figure 8G:
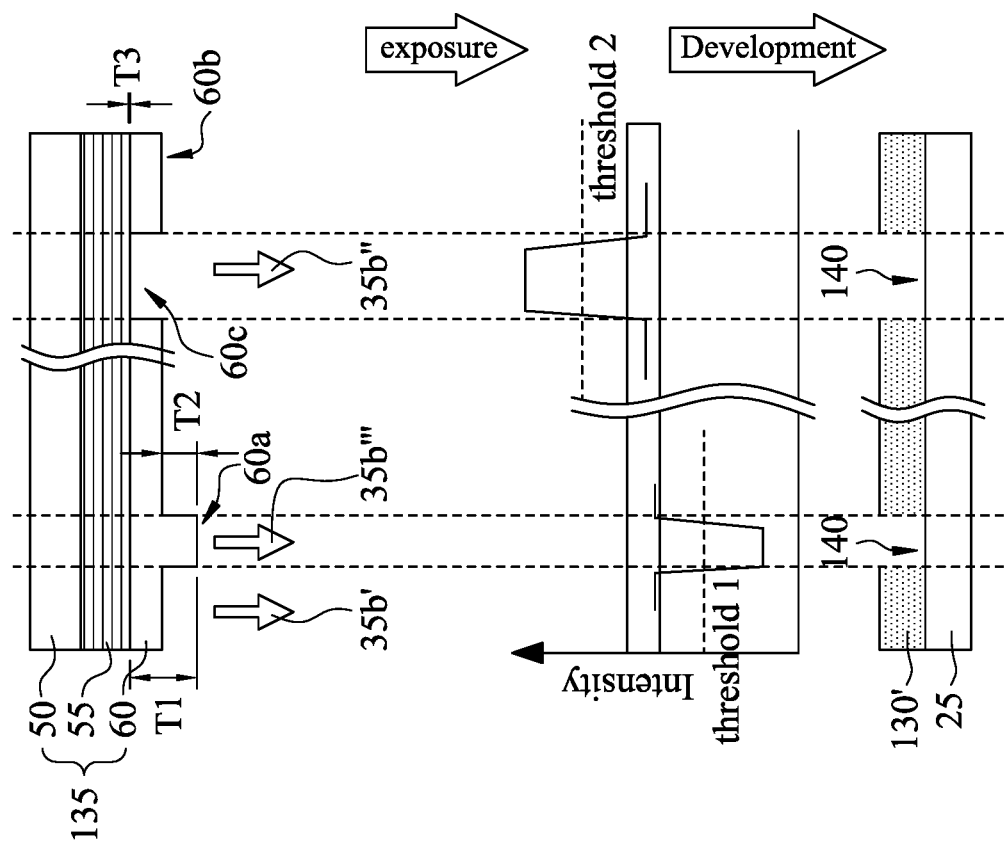
FIG. 8G illustrates the exposure and development of an amphoteric resist according to embodiments of the disclosure.

In some embodiments, the amount of incident radiation 35a that is absorbed or reflected depends on the thickness of the absorber layer 60. As shown in FIG. 8B, the dark-field area 60a of the absorber layer 60 is thicker than the gray-field area 60b and the gray-field area 60b of the absorber layer 60 is thicker than the bright-field area 60c. In some embodiments, the absorber layer 60 is formed of the same material in the dark-field area 60a and the gray-field area 60b, and if there is any absorber layer material in the bright-field area 60c the absorber layer material is the same as in the gray-field area 60b and the dark-field area 60a. In some embodiments, the tri-tone photomask 135 has a first region 60a with a first absorber layer thickness T1, a second region 60b with a second absorber layer thickness T2, and a third region 60c with a third absorber layer thickness T3, wherein T1>T2>T3 (see FIG. 8G). In some embodiments, $0.67T1 \geq T2 \geq 0.33T1$. In some embodiments, $0.25T1 \geq T3 \geq 0$.

Because of the different thicknesses of the absorber tri-tone photomask corresponding portions of the amphoteric photoresist layer 130 receive different exposure doses of actinic radiation. In some embodiments, a first region 130" of the amphoteric resist layer is exposed to a first exposure dose D1 of actinic radiation 35b, a second region 130' of the amphoteric resist layer is exposed to a second dose D2 of the actinic radiation 35b, and a third region 130 of the amphoteric resist layer is exposed to a third dose D3 of the actinic radiation, and D1>D2>D3. As shown in FIG. 8B, the first region 130", second region 130', and third region 130 are exposed during a same selective exposure operation by a same actinic radiation 35a beam impinging on a same photomask 135. In some embodiments, $0.67D1 \geq D2 \geq 0.33D1$. In some embodiments, $0.25D1 \geq D3 \geq 0$.

In some embodiments, the amphoteric photoresist layer 130, 130', 130" undergoes a post-exposure baking (PEB) operation after the selective exposure to actinic radiation 35b before developing the selectively exposed photoresist layer. The exposed amphoteric resist layer 130, 130', 130" is subsequently developed using a developer to form a pattern in the amphoteric photoresist layer. In some embodiments, openings 140 are formed in the amphoteric photoresist layer 130' as shown in FIG. 6C.

Using the patterned photoresist layer 130' as a mask, the openings 140 in the photoresist layer are extended into an underlying layer 25, such as the hard mask layer, forming openings 140' in the underlying layer using a suitable etching operation, as shown in FIG. 8D. In some embodiments, the patterned photoresist layer 130' is removed using a suitable etching or photoresist stripping operation, as shown in FIG. 8E. The pattern in the hard mask layer 25 is subsequently extended into the target layer 20 forming openings 140", as shown in FIG. 8F, using a suitable etching operation.

FIG. 8G illustrates the radiation reflected off of the tri-tone photomask 135 in FIG. 8B, the sensitivity of the amphoteric photoresist layer to the various exposure doses reflected off the tri-tone photomask, and the corresponding pattern formed in the selectively exposed photoresist layer 130' after development. As shown in FIG. 8G, the tri-tone photomask reflects three different doses of actinic radiation. The highest dose D1 of reflected radiation 35b" is reflected from the regions 60c where the absorber layer 60 is the thinnest or non-existent. An intermediate dose D2 of reflected radiation 35b' is reflected from the regions 35b' where the absorber layer has an intermediate thickness T2. A lowest dose D3 of reflected radiation 35b''', including substantially no reflected radiation, is reflected from the regions 60a where the absorber layer 60 has the greatest thickness T1. The left side of the photomask 135 has a dark feature 60a over a bright-field 60b, while the right side of the photomask 135 has a bright feature 60c over a dark-field 60b. In other words, the regions having the intermediate absorber thickness are relatively bright in a dark field and relatively dark in a bright field. In some embodiments, the left side of the photomask 135 is used to expose portions of the photoresist layer 130 where pattern features having a smaller pitch are formed and the right side of the photomask 135 is used to expose portions of the photoresist layer 130 where pattern features having a larger pitch are formed. For example, in some embodiments, the left side of the photomask is used to form pattern features having a pitch of about 20 nm or less and the right side of the photomask 135 is used to form pattern features having a pitch of about 35 nm or more.

As shown in FIG. 8G, when the exposure dose is below the first threshold, the Type II amphoteric photoresist is substantially soluble in the developer and when the exposure dose exceeds the first threshold, the amphoteric photoresist is substantially insoluble in the developer. The Type II amphoteric photoresist has a second development threshold, where at an exposure dose greater than the second threshold substantial development again occurs, as shown in FIG. 8G. In some embodiments, when the dose D3 is smaller than the first threshold, the dose D2 is greater than the first threshold and smaller than the second threshold, and the first dose D1 is greater than the second threshold, the combination of the dark on bright-field exposure and bright on dark-field exposure produces the photoresist pattern shown in FIG. 8G.

Figure 9:
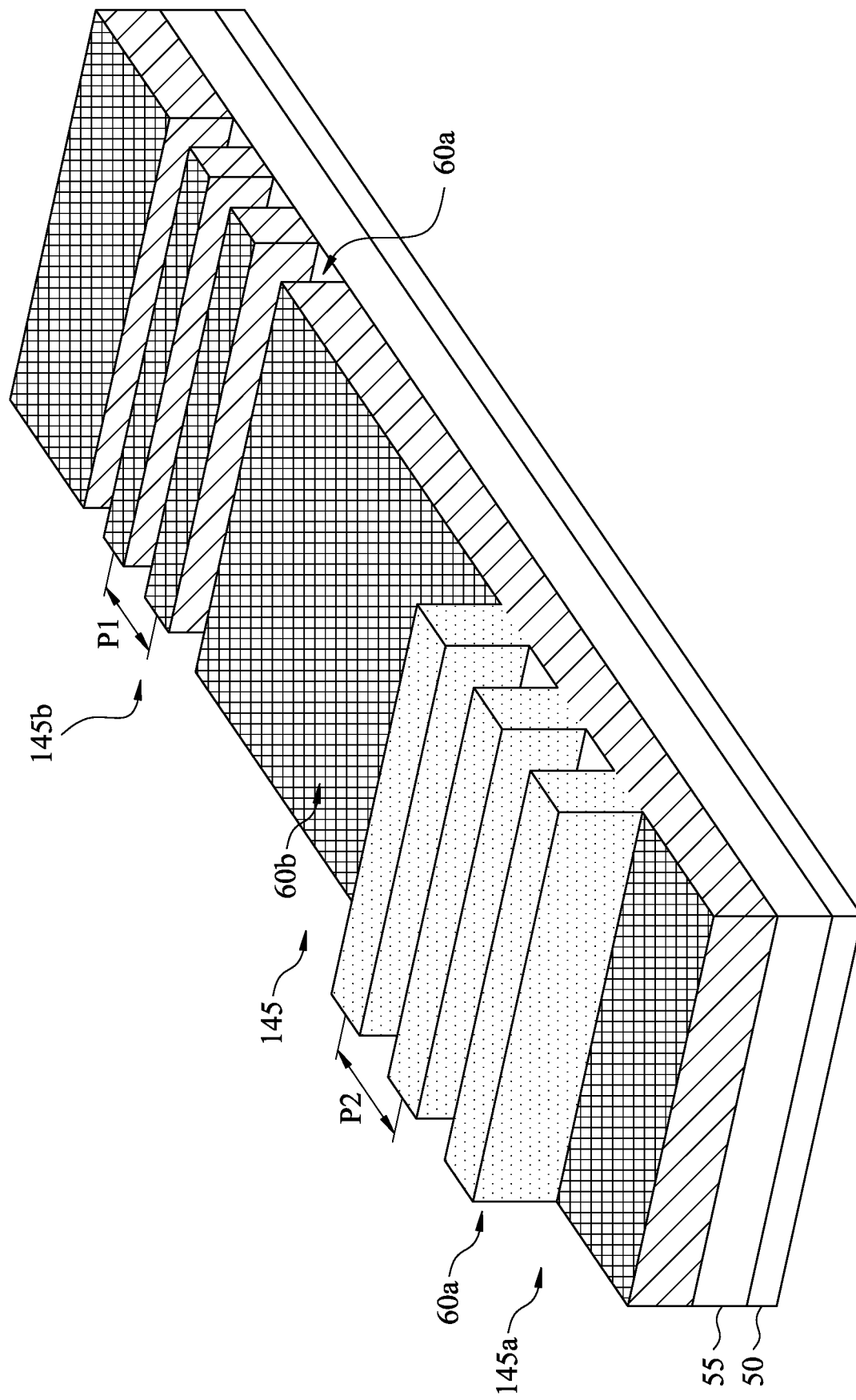
FIG. 9 illustrates a tri-tone photomask according to an embodiment of the disclosure.

FIG. 9 is an illustration of a tri-tone photomask 145 having dark-field exposure regions 145a and bright-field exposure regions 145b. In some embodiments, the pitch P2 of the patterns in the dark-field exposure regions 145a on the left side of the photomask 145 is greater than the pitch P1 of the pattern features in the bright-field exposure regions 145b. In some embodiments, the tri-tone photomask 145 is different from a phase shift photomask.

Other embodiments include other operations before, during, or after the operations described above. In some embodiments, the disclosed methods include forming fin field effect transistor (FinFET) structures. In some embodiments, a plurality of active fins is formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/ drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed.

Some features are better resolved by positive-tone development and other features are better resolved by negative-tone development. These features can be simultaneously exposed on the photoresist layer by different bright field and dark field exposures using photomasks with different tones. In some embodiments, multiple sequential exposures are made using a positive-tone photoresist followed by a negative-tone photoresist, or vice versa. In some embodiments, a first region of the substrate is coated with a negative-tone photoresist and a second region of the substrate is coated with a positive-tone photoresist, and both the negative-tone and positive-tone photoresists are patternwise exposed to actinic radiation substantially simultaneously in a same exposure operation. Lithographic performance can be improved across multiple features because certain mask tone and photoresist development combinations can independently benefit certain pattern pitches. Embodiments of the disclosure provide the benefit of both bright field exposure and dark field exposure, and positive-tone development and negative-tone development on the same layer of a semiconductor device substrate. Embodiments of the disclosure provide improved photolithographic pattern resolution, improved line-width roughness (LWR), and improved edge-width roughness (EWR) resulting in decreased defects and improved semiconductor device yield. Embodiments of the disclosure provide an economically efficient way to increase device yield and performance.

An embodiment of the disclosure is a method of manufacturing a semiconductor device, including forming a first tone resist layer over an underlayer. The first tone resist layer is patterned to form a first pattern exposing a portion of the underlayer. The first pattern is extended into the underlayer, and the first tone resist layer is removed. A second tone resist layer is formed over the underlayer, wherein the second tone is opposite the first tone. The second tone resist layer is patterned to form a second pattern exposing another portion of the underlayer. The second pattern is extended into underlayer, and the second tone resist layer is removed. In an embodiment, patterning the first tone resist layer includes selectively exposing the first tone resist layer to actinic radiation, and developing the selectively exposed first tone resist layer to form the first pattern in the first tone resist layer. In an embodiment, patterning the second tone resist layer includes selectively exposing the second tone resist layer to actinic radiation, and developing the selectively exposed second tone resist layer to form the second pattern in the second tone resist layer. In an embodiment, extending the first pattern into the underlayer and extending the second pattern into the underlayer includes etching the underlayer. In an embodiment, the first tone resist layer is made of a positive-tone photoresist and the second tone resist layer is a made of a negative-tone photoresist. In an embodiment, the first tone resist layer is made of a negative-tone photoresist and the second tone resist layer is a made of a positive-tone photoresist. In an embodiment, the method includes, before forming the first tone resist layer, forming a target layer over a substrate and forming the underlayer over the target layer. In an embodiment, the first pattern has a first pitch, the second pattern has a second pitch, and the first and the second pitch are different.

Another embodiment of the disclosure includes a method of manufacturing a semiconductor device, includes forming a first tone resist layer over an underlayer and removing a portion of the first tone resist layer to expose a portion of the underlayer. A second tone resist layer is formed over the exposed portion of the underlayer, wherein the second tone is opposite the first tone. The first tone resist layer and the second tone resist layer are exposed to actinic radiation, and the first tone resist layer and the second tone resist layer are developed to form a pattern in first tone resist layer and the second tone resist layer exposing a portion of the underlayer. In an embodiment, removing a portion of the first tone resist layer includes exposing the first tone resist layer to actinic radiation and developing the exposed first tone resist layer to form a pattern in the first tone resist layer. In an embodiment, the method includes, before forming the first tone resist layer, forming a target layer over a substrate and forming the underlayer over the target layer. In an embodiment, the underlayer is a hard mask layer and the target layer is a dielectric layer. In an embodiment, the first tone resist layer is made of a positive-tone photoresist and the second tone resist layer is a made of a negative-tone photoresist. In an embodiment, the first tone resist layer is made of a negative-tone photoresist and the second tone resist layer is a made of a positive-tone photoresist. In an embodiment, the actinic radiation is extreme ultraviolet (XUV) radiation.

Another embodiment of the disclosure includes method of manufacturing a semiconductor device, includes forming an amphoteric resist layer over an underlayer. The amphoteric resist has a first development threshold at a first actinic radiation dose where the development rate changes from either a lower development rate to a higher development rate or from a higher development rate to a lower development rate. The amphoteric resist has a second development threshold at a second actinic radiation dose, wherein the second actinic radiation dose has a greater intensity than the first radiation dose, where the development rate changes from either a lower development rate to a higher development rate or from a higher development rate to a lower development rate. The amphoteric resist layer is exposed to actinic radiation using a photomask having a first region with a first absorber layer thickness T1, a second region with a second absorber layer thickness T2, and a third region with a third absorber layer thickness T3, wherein T1>T2>T3. The exposed amphoteric resist layer is developed to form a pattern exposing a portion of the underlayer. In an embodiment, $0.67T1 \geq T2 \geq 0.33T1$. In an embodiment, $0.25T1 \geq T3 \geq 0$. In an embodiment, the photomask is a reflective photomask, and the actinic radiation is extreme ultraviolet radiation (XUV). In an embodiment, the pattern has a first pitch and a second pitch different from the first pitch.

Another embodiment of the disclosure includes a method of manufacturing a semiconductor device, includes forming an amphoteric photoresist layer over a substrate. The amphoteric resist has a first development threshold at a first actinic radiation dose having a first intensity where the development rate changes from either a lower development rate to a higher development rate or from a higher development rate to a lower development rate. The amphoteric resist has a second development threshold at a second actinic radiation dose having a second intensity, wherein the second intensity is greater than the first intensity, where the development rate changes from either a lower development rate to a higher development rate or from a higher development rate to a lower development rate. The amphoteric photoresist layer is exposed to actinic radiation. A first region of the amphoteric resist layer is exposed to a first exposure dose D1 of actinic radiation, a second region of the amphoteric resist layer is exposed to a second dose D2 of the actinic radiation, and a third region of the amphoteric resist layer is exposed to a third dose D3 of the actinic radiation, and wherein D1>D2>D3. The first region, second region, and third region are exposed during a same selective exposure operation by a same actinic radiation beam impinging on a same photomask. The exposed amphoteric resist layer is developed using a developer to form a pattern in the amphoteric photoresist layer. In an embodiment, 0.67D1≥D2≥0.33D1. In an embodiment, 0.25D1≥D3≥0. In an embodiment, the photomask is a tri-tone photomask. In an embodiment, the photomask is a reflective photomask, and the actinic radiation is extreme ultraviolet radiation (XUV). In an embodiment, the method includes, before forming the amphoteric resist layer, forming a target layer over a substrate, and forming a hard mask layer over the target layer. In an embodiment, wherein the pattern has a first pitch and a second pitch different from the first pitch. In an embodiment, the method includes extending the pattern in the amphoteric photoresist layer into the dielectric layer. In an embodiment, after the exposing the amphoteric photoresist layer to actinic radiation the second region is more soluble in the developer than the first region and the third region. In an embodiment, after the exposing the amphoteric photoresist layer to actinic radiation the first region and the third region are more soluble in the developer than the second region.

Another embodiment of the disclosure includes a method of manufacturing a semiconductor device, including forming a target layer over a substrate and forming a hard mask layer over the target layer. A first photoresist layer is formed over the hard mask layer. The first photoresist layer is selectively exposed to actinic radiation to form a first latent pattern in the first photoresist layer. A first developer is applied to the selectively exposed first photoresist layer to form a first pattern in the first photoresist layer exposing a first portion of the hard mask layer. The first pattern is extended into the hard mask layer. The first photoresist layer is removed after extending the first pattern into the hard mask layer. A second photoresist layer is formed over the hard mask layer. A tone of the second photoresist layer is opposite a tone of the first photoresist layer. The second photoresist layer is selectively exposed to form a second latent pattern in the second photoresist layer. A second developer is applied to the selectively exposed second photoresist layer to form a second pattern in the second photoresist layer exposing a second portion of the hard mask layer. The second pattern is extended into the hard mask layer, and the second photoresist layer is removed after extending the second pattern into hard mask layer. In an embodiment, a composition of the first developer and a composition of the second developer are different. In an embodiment, the first photoresist layer is made of a positive-tone photoresist and the second photoresist layer is a made of a negative-tone photoresist. In an embodiment, the first photoresist layer is made of a negative-tone photoresist and the second photoresist layer is a made of a positive-tone photoresist. In an embodiment, wherein the first pattern has a first pitch, the second pattern has a second pitch, and the first and the second pitch are different.

Another embodiment of the disclosure is a method of manufacturing a semiconductor device, including forming a target layer over a substrate and forming a hard mask layer over the target layer. A first photoresist layer is formed over the target layer over the hard mask layer. The first photoresist layer is selectively exposed to actinic radiation to form a first latent pattern in the first photoresist layer. A first developer is applied to the selectively exposed first photoresist layer to form a first pattern in the first photoresist layer exposing a first portion of the hard mask layer. A second photoresist layer is formed over the exposed first portion of the hard mask layer. The first photoresist layer and the second photoresist layer are selectively exposed to actinic radiation form a second latent pattern in the first photoresist layer and the second photoresist layer. A second developer is applied to the selectively exposed patterned first photoresist layer and the second photoresist layer to form a second pattern in the patterned first photoresist layer and the second photoresist layer. In an embodiment, the method includes extending the second pattern into the hard mask layer and the target layer. In an embodiment, the first photoresist layer is made of a positive-tone photoresist and the second photoresist layer is a made of a negative-tone photoresist. In an embodiment, the first photoresist layer is made of a negative-tone photoresist and the second photoresist layer is a made of a positive-tone photoresist. In an embodiment, the actinic radiation is extreme ultraviolet (XUV) radiation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising, forming an amphoteric resist layer comprising an amphoteric resist over an underlayer, wherein the amphoteric resist has a first development threshold at a first actinic radiation dose where the development rate changes from either a lower development rate to a higher development rate or from a higher development rate to a lower development rate, and the amphoteric resist has a second development threshold at a second actinic radiation dose, wherein the second actinic radiation dose has a greater intensity than the first radiation dose, where the development rate changes from either a lower development rate to a higher development rate or from a higher development rate to a lower development rate;

exposing the amphoteric resist layer to actinic radiation using a photomask having a first region with a first absorber layer thickness T1, a second region with a second absorber layer thickness T2, and a third region with a third absorber layer thickness T3,
wherein T1>T2>T3; and
developing the exposed amphoteric resist layer to form a pattern exposing a portion of the underlayer,
wherein the pattern has a first pitch and a second pitch different from the first pitch.

2. The method according to claim 1, wherein $0.67T1 \geq T2 \geq 0.33T1$.

3. The method according to claim 1, wherein $0.25T1 \geq T3 \geq 0$.

4. The method according to claim 1, wherein the photomask is a reflective photomask, and the actinic radiation is extreme ultraviolet radiation (XUV).

5. The method according to claim 1, further comprising extending the pattern into the substrate.

6. The method according to claim 5, wherein extending the pattern into the substrate includes etching the substrate.

7. A method of manufacturing a semiconductor device, comprising,
forming an amphoteric photoresist layer over a substrate;
wherein the amphoteric resist has a first development threshold at a first actinic radiation dose having a first intensity where the development rate changes from either a lower development rate to a higher development rate or from a higher development rate to a lower development rate, and
the amphoteric resist has a second development threshold at a second actinic radiation dose having a second intensity, wherein the second intensity is greater than the first intensity, where the development rate changes from either a lower development rate to a higher development rate or from a higher development rate to a lower development rate;
exposing the amphoteric photoresist layer to actinic radiation,
wherein a first region of the amphoteric resist layer is exposed to a first exposure dose D1 of actinic radiation, a second region of the amphoteric resist layer is exposed to a second dose D2 of the actinic radiation, and a third region of the amphoteric resist layer is exposed to a third dose D3 of the actinic radiation,
wherein D1>D2>D3, and
wherein the first region, second region, and third region are exposed during a same selective exposure operation by a same actinic radiation beam impinging on a same photomask; and
developing the exposed amphoteric resist layer using a developer to form a pattern in the amphoteric photoresist layer,
wherein the pattern has a first pitch and a second pitch different from the first pitch.

8. The method according to claim 7, wherein $0.67D1 \geq D2 \geq 0.33D1$.

9. The method according to claim 7, wherein $0.25D1 \geq D3 \geq 0$.

10. The method according to claim 7, wherein the photomask is a tri-tone photomask.

11. The method according to claim 7, wherein the photomask is a reflective photomask, and the actinic radiation is extreme ultraviolet radiation (XUV).

12. The method according to claim 7, further comprising before forming the amphoteric resist layer:
forming a target layer over a substrate; and
forming a hard mask layer over the target layer.

13. The method according to claim 12, further comprising extending the pattern in the amphoteric photoresist layer into the hard mask layer.

14. The method according to claim 7, wherein after the exposing the amphoteric photoresist layer to actinic radiation the second region is more soluble in the developer than the first region and the third region.

15. The method according to claim 7, wherein after the exposing the amphoteric photoresist layer to actinic radiation the first region and the third region are more soluble in the developer than the second region.

16. A method of manufacturing a semiconductor device, comprising,
forming a hard mask layer over a substrate;
forming an amphoteric resist layer comprising an amphoteric resist material over the hard mask layer;
exposing the amphoteric resist layer to actinic radiation using a reflective tri-tone photomask,
wherein a first region of the amphoteric resist layer is exposed to a first exposure dose D1 of actinic radiation, a second region of the amphoteric resist layer is exposed to a second dose D2 of the actinic radiation, and a third region of the amphoteric resist layer is exposed to a third dose D3 of the actinic radiation,
wherein D1, D2, and D3 are different exposure doses, and
wherein the first region, second region, and third region are exposed during a same exposure operation by a same actinic radiation beam impinging on the reflective tri-tone photomask; and
developing the exposed amphoteric resist layer using a developer to form a pattern in the amphoteric photoresist layer,
wherein after the exposing the amphoteric photoresist layer to actinic radiation the first and third regions are more soluble in the developer than the second region.

17. The method according to claim 16, wherein the actinic radiation is extreme ultraviolet radiation (XUV).

18. The method according to claim 16, wherein the pattern has a first pitch and a second pitch different from the first pitch.

19. The method according to claim 16, further comprising extending the pattern in the amphoteric photoresist layer into the hard mask layer.

20. The method according to claim 19, wherein extending the pattern into the hard mask layer includes etching the hard mask layer.

* * * * *